(12) United States Patent
Tanaka

(10) Patent No.: US 10,879,497 B2
(45) Date of Patent: Dec. 29, 2020

(54) ORGANIC ELECTROLUMINESCENT DEVICE, DISPLAY DEVICE, AND ILLUMINATION DEVICE

(71) Applicant: LUMIOTEC INC., Yonezawa (JP)

(72) Inventor: Junichi Tanaka, Yonezawa (JP)

(73) Assignee: LUMIOTEC INC., Yamagata (JP)

( * ) Notice: Subject to any disclaimer, the term of this patent is extended or adjusted under 35 U.S.C. 154(b) by 0 days.

(21) Appl. No.: 16/485,092

(22) PCT Filed: Feb. 9, 2018

(86) PCT No.: PCT/JP2018/004614
§ 371 (c)(1),
(2) Date: Aug. 9, 2019

(87) PCT Pub. No.: WO2018/147416
PCT Pub. Date: Aug. 16, 2018

(65) Prior Publication Data
US 2020/0028121 A1 Jan. 23, 2020

(30) Foreign Application Priority Data

Feb. 10, 2017 (JP) ................................. 2017-023305

(51) Int. Cl.
*H01L 51/52* (2006.01)
*H01L 51/50* (2006.01)

(52) U.S. Cl.
CPC ........ *H01L 51/5278* (2013.01); *H01L 51/504* (2013.01); *H01L 51/5056* (2013.01)

(58) Field of Classification Search
CPC ............... H01L 51/5278; H01L 51/504; H01L 51/5056; H01L 27/3244; H01L 27/3213;
(Continued)

(56) References Cited

U.S. PATENT DOCUMENTS

2003/0189401 A1 10/2003 Kido et al.
2007/0001587 A1* 1/2007 Hatwar ............... H01L 51/5278
313/504

(Continued)

FOREIGN PATENT DOCUMENTS

JP 2003-272860 A 9/2003
JP 2006-165271 A 6/2006
(Continued)

OTHER PUBLICATIONS

International Search Report issued in PCT/JP2018/004614 (PCT/ISA/210), dated Apr. 3, 2018.
(Continued)

*Primary Examiner* — Kevin Quarterman
(74) *Attorney, Agent, or Firm* — Birch, Stewart, Kolasch & Birch, LLP

(57) ABSTRACT

An organic electroluminescent device having a white light, obtained by light emission from a plurality of light emission units, that comprises red light, green light, and blue light. Among the distribution characteristics of light emitted inside a substrate, the brightness of the white light has a maximum value within an angle range of 0-15° from an axis perpendicular to the planar direction of the substrate and the spectral radiance of the blue light at the maximum emission wavelength has a maximum value within the angle range of 0-20° from the axis perpendicular to the planar direction of the substrate.

27 Claims, 13 Drawing Sheets

(58) Field of Classification Search
CPC ....... H01L 27/322; H05B 33/02; H05B 33/04; H05B 33/12; G02B 5/20; G09F 9/30
See application file for complete search history.

(56) References Cited

U.S. PATENT DOCUMENTS

| | | |
|---|---|---|
| 2007/0182317 A1 | 8/2007 | Kido et al. |
| 2011/0057210 A1* | 3/2011 | Sonoda ............... H01L 51/5275 257/88 |
| 2012/0025180 A1 | 2/2012 | Matsumoto |
| 2012/0132895 A1 | 5/2012 | Kido et al. |
| 2012/0248970 A1 | 10/2012 | Okuyama et al. |
| 2014/0022769 A1* | 1/2014 | Kubota ................. H01L 51/504 362/154 |
| 2014/0151648 A1 | 6/2014 | Kido |
| 2015/0249230 A1 | 9/2015 | Kido |
| 2015/0280158 A1* | 10/2015 | Ogiwara ............ H01L 51/5044 257/40 |
| 2016/0359143 A1 | 12/2016 | Osawa et al. |
| 2018/0208836 A1* | 7/2018 | Kuma ................. H01L 51/0056 |
| 2018/0277796 A1 | 9/2018 | Kido et al. |
| 2018/0277797 A1 | 9/2018 | Kido et al. |
| 2018/0351134 A1 | 12/2018 | Kido et al. |

FOREIGN PATENT DOCUMENTS

| | | |
|---|---|---|
| JP | 2012-227122 A | 11/2012 |
| JP | 2014-22099 A | 2/2014 |
| JP | 2016-110702 A | 6/2016 |
| JP | 2016-225221 A | 12/2016 |
| WO | WO 2010/113493 A1 | 10/2010 |

OTHER PUBLICATIONS

Written Opinion of the International Searching Authority issued in PCT/JP2018/004614 (PCT/ISA/237), dated Apr. 3, 2018.

* cited by examiner

FIG.9

| CATHODE 100nm |
| --- |
| ELECTRON TRANSPORT LAYER 36nm |
| BLUE LIGHT EMITTING LAYER 25nm 5% |
| HOLE TRANSPORT LAYER 90nm |
| CHARGE GENERATING LAYER 11nm |
| ELECTRON TRANSPORT LAYER 48nm |
| GREEN LIGHT EMITTING LAYER 17nm 20% |
| RED LIGHT EMITTING LAYER 13nm 2% |
| HOLE TRANSPORT LAYER 90nm |
| ANODE 100nm |
| GLASS SUBSTRATE 0.7mm |

FIG.12

| CATHODE 100nm |
| --- |
| ELECTRON TRANSPORT LAYER 36nm |
| BLUE LIGHT EMITTING LAYER 25nm 5% |
| HOLE TRANSPORT LAYER 90nm |
| CHARGE GENERATING LAYER 11nm |
| ELECTRON TRANSPORT LAYER 43nm |
| GREEN LIGHT EMITTING LAYER 17nm 20% |
| RED LIGHT EMITTING LAYER 13nm 2% |
| HOLE TRANSPORT LAYER 90nm |
| ANODE 300nm |
| GLASS SUBSTRATE 0.7mm |

US 10,879,497 B2

ORGANIC ELECTROLUMINESCENT DEVICE, DISPLAY DEVICE, AND ILLUMINATION DEVICE

TECHNICAL FIELD

The present invention relates to an organic electroluminescent device and to a display device and an illumination device including the same.

The present application claims the benefit of priority of Japanese Patent Application No. 2017-23305 filed on Feb. 10, 2017, the contents of which are incorporated herein by reference.

BACKGROUND ART

An organic electroluminescent element (hereafter, also referred to as "organic EL element" for short) is a self-luminescent element including a light emitting layer, made of an organic compound, between a cathode and an anode facing each other. When voltage is applied between the cathode and the anode, electrons injected into the light emitting layer from the cathode side and holes injected into the light emitting layer from the anode side recombine in the light emitting layer to form excitons and the excitons causes the organic EL element to emit light.

As an organic EL element capable of achieving high luminance and longlife, there is known an element with a multi-photon emission structure (hereafter, referred to as "MPE element" for short) in which a light emitting unit including at least one light emitting layer is considered as one unit and an electrically-insulating charge generating layer is arranged between multiple light emitting units (for example, see Patent Document 1). In the MPE element, when voltage is applied between a cathode and an anode, charges in a charge transfer complex move to the cathode side and the anode side. In the MPE element, holes are thereby injected into one light emitting unit located on the cathode side of the charge generating layer and electrons are injected into another light emitting unit located on the anode side of the charge generating layer. In such an MPE element, since light can be simultaneously emitted from the multiple light emitting units with the same current amount, a current efficiency and an external quantum efficiency multiplied by the number of the light emitting units can be achieved.

However, when light is to be extracted to the outside through a substrate in the MPE element, it is difficult to appropriately control the distribution characteristics of light emitted from the element into the substrate and the technology has not yet reached the level where the light can be sufficiently extracted to the outside. Since the MPE element is formed of multiple light emitting units, there are many layers forming the element. Accordingly, the MPE element has a problem that it is difficult to individually control the optical characteristics of the respective layers and a suitable optical design for optimizing the distribution characteristics of light emitted from the element into the substrate is not achieved.

PRIOR ART DOCUMENT

Patent Document

Patent Document 1: Japanese Patent Application Publication No. 2003-272860

SUMMARY OF THE INVENTION

Problems to be Solved by the Invention

The present invention has been proposed in view of the aforementioned conventional circumstances and an object thereof is to provide an organic electroluminescent device which can provide white light with high color temperature and an excellent color rendering property by being optimized in total luminous flux and is thus suitable for a display device and a lighting device and also provide a display device and a lighting device including this organic electroluminescent device.

Means for Solving the Problems

To achieve the above object, provided are the following aspects.

(1) An organic electroluminescent device having a structure in which a plurality of light emitting units each including a light emitting layer made of at least an organic compound are stacked one on top of another between a first electrode and a second electrode with a charge generating layer sandwiched between each pair of the adjacent light emitting units, the organic electroluminescent device capable of providing white light through a substrate adjacent to the first electrode or the second electrode by causing the plurality of light emitting units to emit light, wherein the white light produced by light emission of the plurality of light emitting units is formed of red light, green light, and blue light, distribution characteristics of light emitted into the substrate are such that a luminance of the white light takes a maximum in an angle range of 0 to 15 degrees with respect to an axis perpendicular to a plane direction of the substrate, and a spectral radiance at a maximum emission wavelength of the blue light takes a maximum in an angle range of 0 to 20 degrees with respect to the axis perpendicular to the plane direction of the substrate.

(2) The organic electroluminescent device according to the above aspect (1), wherein the distribution characteristics of the light emitted into the substrate are such that the spectral radiance at the maximum emission wavelength of the blue light takes a local maximum in an angle range of 40 to 60 degrees with respect to the axis perpendicular to the plane direction of the substrate.

(3) The organic electroluminescent device according to the above aspect (1) or (2), wherein correlated color temperature of the white light is 3500 K or more.

(4) The organic electroluminescent device according to any one of the above aspects (1) to (3), wherein one of the plurality of light emitting units includes a blue light emitting layer which emits the blue light, and the blue light emitting layer is formed of a blue fluorescent light emitting layer containing a blue fluorescent material.

(5) The organic electroluminescent device according to the above aspect (4), wherein the blue light includes a delayed fluorescence component.

(6) The organic electroluminescent device according to any one of the above aspects (1) to (3), wherein one of the plurality of light emitting units includes a blue light emitting layer which emits the blue light, and the blue light emitting layer is formed of a blue phosphorescent light emitting layer containing a blue phosphorescent material.
(7) The organic electroluminescent device according to any one of the above aspects (1) to (6), wherein an average color rendering index (Ra) of the white light is 70 or more.
(8) The organic electroluminescent device according to any one of the above aspects (1) to (7), the organic electroluminescent device having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent device capable of providing the white light through the substrate adjacent to the first electrode or the second electrode by causing the plurality of light emitting units to emit light, comprising:
a first light emitting unit formed of a blue light emitting unit including a blue light emitting layer which emits the blue light; and
a second light emitting unit formed of a red/green light emitting unit including a red light emitting layer which emits the red light and a green light emitting layer which emits the green light or of a red-green light emitting unit which emits the red light and the green light, wherein
the first light emitting unit and the second light emitting unit are stacked one on top of the other with a first charge generating layer sandwiched therebetween, and
the organic electroluminescent device has a structure in which the second electrode, the second light emitting unit, the first charge generating layer, the first light emitting unit, and the first electrode are stacked one on top of another in this order.
(9) The organic electroluminescent device according to any one of the above aspects (1) to (7), the organic electroluminescent device having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent device capable of providing the white light through the substrate adjacent to the first electrode or the second electrode by causing the plurality of light emitting units to emit light, comprising:
a first light emitting unit formed of a red/green light emitting unit including a red light emitting layer which emits the red light and a green light emitting layer which emits the green light or of a red-green light emitting unit which emits the red light and the green light; and
a second light emitting unit formed of a blue light emitting unit including a blue light emitting layer which emits the blue light, wherein
the first light emitting unit and the second light emitting unit are stacked one on top of the other with a first charge generating layer sandwiched therebetween, and
the organic electroluminescent device has a structure in which the second electrode, the second light emitting unit, the first charge generating layer, the first light emitting unit, and the first electrode are stacked one on top of another in this order.
(10) The organic electroluminescent device according to anyone of the above aspects (1) to (7), the organic electroluminescent device having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent device capable of providing the white light through the substrate adjacent to the first electrode or the second electrode by causing the plurality of light emitting units to emit light, comprising:
a first light emitting unit formed of a red/green light emitting unit including a red light emitting layer which emits the red light and a green light emitting layer which emits the green light or of a red-green light emitting unit which emits the red light and the green light;
a second light emitting unit formed of a blue light emitting unit including a blue light emitting layer which emits the blue light; and
a third light emitting unit formed of a blue light emitting unit including a blue light emitting layer which emits the blue light, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent device has a structure in which the second electrode, the third light emitting unit, the second charge generating layer, the second light emitting unit, the first charge generating layer, the first light emitting unit, and the first electrode are stacked one on top of another in this order.
(11) The organic electroluminescent device according to anyone of the above aspects (1) to (7), the organic electroluminescent device having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent device capable of providing the white light through the substrate adjacent to the first electrode or the second electrode by causing the plurality of light emitting units to emit light, comprising:
a first light emitting unit formed of a blue light emitting unit including a blue light emitting layer which emits the blue light;
a second light emitting unit formed of a red/green light emitting unit including a red light emitting layer which emits the red light and a green light emitting layer which emits the green light or of a red-green light emitting unit which emits the red light and the green light; and
a third light emitting unit formed of a blue light emitting unit including a blue light emitting layer which emits the blue light, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent device has a structure in which the second electrode, the third light emitting unit, the second charge generating layer, the second light emitting unit, the first charge generating layer, the first light emitting unit, and the first electrode are stacked one on top of another in this order.

(12) The organic electroluminescent device according to any one of the above aspects (1) to (11), wherein
the charge generating layer is formed of an electrically insulating layer made of an electron accepting material and an electron donating material, and
a specific resistance of the electrically insulating layer is $1.0 \times 10^2$ Ω·cm or more.
(13) The organic electroluminescent device according to the above aspect (12), wherein the specific resistance of the electrically insulating layer is $1.0 \times 10^5$ Ω·cm or more.
(14) The organic electroluminescent device according to any one of the above aspects (1) to (11), characterized in that
each of the charge generating layers is formed of a mixed layer of different materials and one component of the mixed layer forms a charge transfer complex by redox, and
when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.
(15) The organic electroluminescent device according to any one of the above aspects (1) to (11), characterized in that
each of the charge generating layers is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.
(16) The organic electroluminescent device according to any one of the above aspects (1) to (15), characterized in that
the charge generating layers contain a compound having a structure expressed by formula (1):

[Chem. 1]

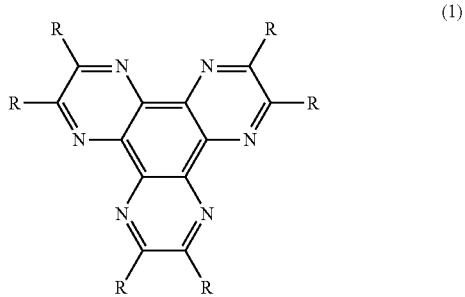

(1)

where R represents an electron withdrawing group of F, Cl, Br, I, CN, or $CF_3$.
(17) The organic electroluminescent device according to anyone of the above aspects (1) to (16), characterized in that
the organic electroluminescent element comprises at least three color filters different from one another, and
an arrangement of the at least three color filters different from one another changes the white light produced by the light emission of the plurality of light emitting units to light of a different color.
(18) The organic electroluminescent device according to the above aspect (17), wherein the arrangement of the at least three color filters different from one another is one selected from the group consisting of a stripe arrangement, a mosaic arrangement, a delta arrangement, and a pentile arrangement.
(19) The organic electroluminescent device according to the above aspect (17) or (18), wherein
the at least three color filters different from one another are a red color filter, a green color filter, and a blue color filter, and
the organic electroluminescent device has an RGB arrangement in which the three color filters different from one another are arranged in turn.
(20) The organic electroluminescent device according to the above aspect (19), wherein
the organic electroluminescent device has an RGBW arrangement including the RGB arrangement, and
the color filters are not arranged in an arrangement portion of W.
(21) The organic electroluminescent device according to the above aspect (20), wherein the RGBW arrangement is one selected from the group consisting of a stripe arrangement, a mosaic arrangement, a delta arrangement, and a pentile arrangement.
(22) A display device comprising the organic electroluminescent device according to any one of the above aspects (17) to (21).
(23) The display device according to the above aspect (22), wherein
the substrate is a base substrate or a sealing substrate,
the base substrate or the sealing substrate is formed of a flexible substrate, and
the display device is flexible.
(24) A lighting device comprising the organic electroluminescent device according to any one of the above aspects (1) to (16).
(25) The lighting device according to the above aspect (24), comprising an optical film on a light extraction surface side of the organic electroluminescent device.
(26) The lighting device according to the above aspect (25), wherein deviation duv of the white light is in a range of −0.01 to +0.01.
(27) The lighting device according to any one of the above aspects (24) to (26), wherein
the substrate is a base substrate or a sealing substrate,
the base substrate or the sealing substrate is formed of a flexible substrate, and
the lighting device is flexible.

Effect of the Invention

According to the one aspect described above, it is possible to provide an organic electroluminescent device which can provide white light with high color temperature and an excellent color rendering property by being optimized in total luminous flux and is thus suitable for a display device and a lighting device and also provide a display device and a lighting device including this organic electroluminescent device.

BRIEF DESCRIPTION OF THE DRAWINGS

FIG. 9 is a cross-sectional view illustrating a schematic structure of an organic EL device of Example 1.

FIG. 12 is a cross-sectional view illustrating a schematic structure of an organic EL device of Example 2.

MODE FOR CARRYING OUT THE INVENTION

Figure 1:
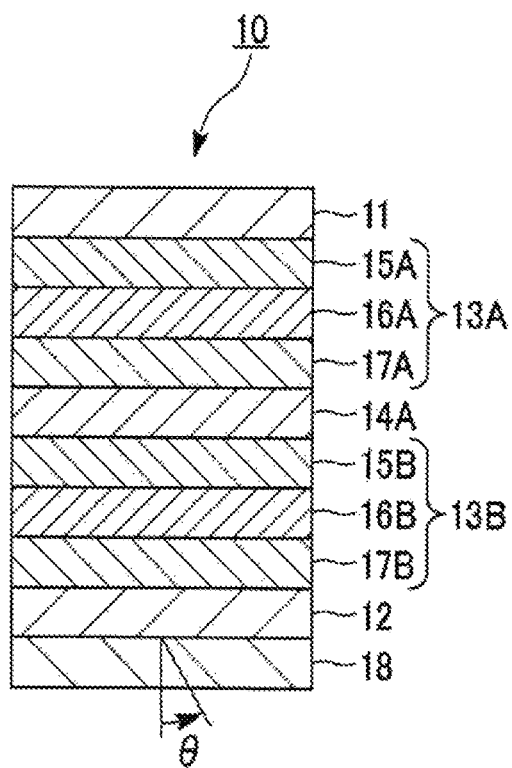
FIG. 1 is a cross-sectional view illustrating a schematic configuration of an organic EL device according to a first embodiment of the present invention.

Detailed description is given of embodiments of an organic electroluminescent device of the present invention and a display device and a lighting device including the same with reference to the drawings.

Note that, for the sake of convenience, in the drawings used in the following description, characteristic parts are sometimes illustrated in an enlarged manner to facilitate understanding of characteristics, and proportions of dimensions of constitutional elements and the like are not always the same as actual ones. Moreover, materials, dimensions, and the like exemplified in the following description are merely examples and the present invention are not necessarily limited to those and can be carried out with the materials, dimensions, and the like appropriately changed within a scope not changing the spirit of the invention.

First Embodiment

"Organic Electroluminescent Device (Organic EL Device)"

FIG. 1 is a cross-sectional view illustrating a schematic configuration of an organic EL device according to a first embodiment of the present invention.

As illustrated in FIG. 1, the organic EL device 10 of the embodiment has a structure in which multiple light emitting units 13A, 13B each including a light emitting layer made of at least an organic compound are stacked one on top of the other between a first electrode 11 and a second electrode 12 with a charge generating layer (CGL) 14A sandwiched between the light emitting units 13A, 13B. The organic EL device 10 is an organic EL device capable of providing white light through a substrate 18 adjacent to the second electrode 12 by causing the multiple light emitting units 13A, 13B to emit light.

Note that the organic EL device 10 of the embodiment may be an organic EL device capable of providing white light through a substrate adjacent to the first electrode 11.

The first light emitting unit 13A is a blue light emitting unit. The blue light emitting unit includes a light emitting layer formed of a blue light emitting layer which emits blue light with one or two maximum emission wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The second light emitting unit 13B is a red/green light emitting unit or a red-green light emitting unit. The red/green light emitting unit includes a light emitting layer formed of a red light emitting layer which emits red light with one maximum emission wavelength in a red wavelength band and a green light emitting layer which emits green light with one or two maximum emission wavelengths in a green wavelength band. Specifically, the red/green light emitting unit is a layer formed by stacking the red light emitting layer and the green light emitting layer one on top of the other. The red light emitting layer may be a red fluorescent light emitting layer containing a red fluorescent material or a red phosphorescent light emitting layer containing a red phosphorescent material. The green light emitting layer may be a green fluorescent light emitting layer containing a green fluorescent material or a green phosphorescent light emitting layer containing a green phosphorescent material. Meanwhile, the red-green light emitting unit includes a light emitting layer formed of a mixed layer of either of the red phosphorescent material or the red fluorescent material and either of the green phosphorescent material or the green fluorescent material. Specifically, the red-green light emitting unit is one layer (single layer) containing either of the red phosphorescent material or the red fluorescent material and either of the green phosphorescent material or the green fluorescent material. The red light and the green light provided by the red/green light emitting unit or the red-green light emitting unit may include a delayed fluorescence component.

The white light provided by the organic EL device 10 of the embodiment is formed of the blue light emitted from the blue light emitting layer in the blue light emitting unit and the red light and the green light emitted from the red/green light emitting unit or the red-green light emitting unit.

The first light emitting unit 13A and the second light emitting unit 13B are stacked one on top of the other with the charge generating layer 14A sandwiched therebetween.

The organic EL device 10 of the embodiment has a structure in which the substrate 18, the second electrode 12, the second light emitting unit 13B, the charge generating layer 14A, the first light emitting unit 13A, and the first electrode 11 are stacked one on top of another in this order. Specifically, the organic EL device 10 of the embodiment has an MPE structure in which the first light emitting unit 13A and the second light emitting unit 13B are stacked one on top of the other with the charge generating layer 14A sandwiched between the light emitting units 13A, 13B.

In the organic EL device 10 of the embodiment, the white light produced by light emission of the first light emitting unit 13A and the second light emitting unit 13B has an emission spectrum continuous over a wavelength band of at least 380 nm to 780 nm.

Distribution characteristics of light emitted into the substrate 18 are such that the luminance of the white light takes the maximum in an angle range of 0 to 15 degrees with respect to an axis perpendicular to a plane direction of the substrate 18.

When the luminance of the white light takes the maximum in a range above 15 degrees with respect to the axis perpendicular to the plane direction of the substrate 18, the luminance in an axial direction perpendicular to the plane direction of the substrate 18 is low and a sufficient luminance cannot be obtained in the case where the organic EL device 10 is used in a display device. Moreover, when an optical film such as a light extraction film is used, the optical film improves the total luminous flux value by extracting red and green light emission components which spread in wide-angle directions with respect to the axis perpendicular to the plane of the substrate 18. However, this causes decreases in the color temperature and the color rendering property.

Moreover, the organic EL device 10 of the embodiment has one or two maximum emission wavelengths in a blue wavelength band of 440 nm to 490 nm, one maximum wavelength in a red wavelength band of 590 nm to 640 nm, and one or two maximum emission wavelengths in a green wavelength band of 500 nm to 560 nm in the emission spectrum of the white light. These maximum emission wavelengths are based on the maximum emission wavelengths of the blue light emitted from a blue light emitting layer (first light emitting layer 16A) in the first light emitting unit 13A and the red light and the green light emitted from a second light emitting layer 16B in the second light emitting unit 13B.

When there is one maximum emission wavelength of the blue light, the light emission intensity of the blue light at this wavelength is higher than one of the light emission intensity at the maximum emission wavelength of the red light and the light emission intensity at the maximum emission wavelength of the green light. Meanwhile, when there are two maximum emission wavelengths of the blue light, the light emission intensity at the shorter maximum emission wavelength of the blue light is higher than one of the light emission intensity at the maximum emission wavelength of the red light and the light emission intensity at the maximum emission wavelength of the green light. As a result, the white light provided by the organic EL device 10 of the embodiment has high color temperature and has a color of pure white to blue white. Moreover, it is possible to improve the color rendering property while maintaining the color of pure white to blue white by reducing the light emission intensity at the maximum emission wavelength of the green light while maintaining the light emission intensity at the maximum emission wavelength of the blue light.

Accordingly, in the organic EL device 10 of the embodiment, the light emission intensity at the maximum emission wavelength of the blue light is important in obtaining suitable light emission characteristics.

In the organic EL device 10 of the embodiment, the distribution characteristics of light emitted into the substrate 18 are such that spectral radiance at the maximum emission wavelength of the blue light takes the maximum in an angle range of 0 to 20 degrees with respect to the axis perpendicular to the plane direction of the substrate 18. When the spectral radiance at the maximum emission wavelength of the blue light takes the maximum in a range above 20 degrees with respect to the axis perpendicular to the plane direction of the substrate 18, the amount of blue light emission component in the axial direction perpendicular to the plane direction of the substrate 18 decreases. Accordingly, the color temperature decreases and the organic EL device 10 is not suitable for use in the display device.

Moreover, in the organic EL device 10 of the embodiment, the distribution characteristics of light emitted into the substrate 18 are preferably such that the spectral radiance at the maximum emission wavelength of the blue light takes the local maximum in an angle range of 40 to 60 degrees with respect to the axis perpendicular to the plane direction of the substrate 18. When the spectral radiance at the maximum emission wavelength of the blue light takes the local maximum in a range below 40 degrees or more than 60 degrees with respect to the axis perpendicular to the plane direction of the substrate 18, the blue light emission component cannot be efficiently extracted even if an optical film is used, and high color temperature cannot be thus achieved.

Meanwhile, the spectral radiance at the maximum emission wavelength of the red light and the spectral radiance at the maximum emission wavelength of the green light each take the maximum in an angle range of 0 to 20 degrees with respect to the axis perpendicular to the plane direction of the substrate 18. However, these maxima do not have that much effect on obtaining the suitable emission characteristics.

A glass substrate or a plastic substrate can be used as the substrate 18.

For example, soda-lime glass, non-alkali glass, borosilicate glass, silicate glass, or the like can be used for the glass substrate.

For example, polyethylene terephthalate (PET), polyethylene naphthalate (PEN), polyimide (PI), or the like can be used for the plastic substrate.

Generally, a metal with a small work function, an alloy of such a metal, a metal oxide, or the like is preferably used as the first electrode 11. For example, as a metal forming the first electrode 11, it is possible to use a metal single substance like an alkaline metal such as lithium (Li), an alkaline earth metal such as magnesium (Mg) or calcium (Ca), or a rare-earth metal such as europium (Eu) or use an alloy containing any of these metals and aluminum (Al), silver (Ag), indium (In), or the like.

Alternatively, the first electrode 11 may have a configuration in which an organic layer doped with a metal is used in an interface between the first electrode 11 and an organic layer as described in, for example, "Japanese Patent Application Publication No. Hei 10-270171" and "Japanese Patent Application Publication No. 2001-102175." In this case, it is only necessary to use an electrically conductive material as the material of the first electrode 11 and the material is not limited to one with particular properties such as the work function.

As another alternative, the first electrode 11 may have a configuration in which an organic layer in contact with the first electrode 11 is made of an organic metal complex compound containing at least one type selected from the group consisting of alkali metal ions, alkaline earth metal ions, and rare-earth metal ions as described in, for example, "Japanese Patent Application Publication No. Hei 11-233262" and "Japanese Patent Application Publication No. 2000-182774." In this case, a metal capable of reducing the metal ions contained in the organic metal complex compound to metal in vacuum, for example, a metal (with a thermal reduction property) such as aluminum (Al), zirconium (Zr), titanium (Ti), and silicon (Si) or an alloy containing any of these metals can be used as the first electrode 11. Among these, Al which is generally widely used as a wiring electrode is particularly preferable from the viewpoint of ease of vapor deposition, high light reflectance, chemical stability, and the like.

The material of the second electrode 12 is not limited to a particular material. When light is to be extracted from the second electrode 12 side, a transparent, electrically conductive material such as, for example, ITO (Indium Tin Oxide) or IZO (Indium Zinc Oxide) can be used.

Moreover, in contrary to a general organic EL element, light can be extracted from the first electrode 11 side by using a metal material or the like for the second electrode 12 and using a transparent, electrically conductive material for the first electrode 11. For example, by employing the method described in "Japanese Patent Application Publication No. 2002-332567," the first electrode 11 made of the aforementioned transparent, electrically conductive material such as ITO and IZO can be formed by sputtering which does not damage an organic film.

Accordingly, when both of the first electrode 11 and the second electrode 12 are formed to be transparent, since the first light emitting unit 13A, the second light emitting unit 13B, and the first charge generating layer 14A are also similarly transparent, it is possible to manufacture a transparent organic EL device 10.

Note that the order of film formation does not have to start from the second electrode 12 side and may start from the first electrode 11 side.

The first light emitting unit 13A is formed of a first electron transport layer 15A, a first light emitting layer 16A, and a first hole transport layer 17A. The second light emitting unit 13B is formed of a second electron transport layer 15B, a second light emitting layer 16B, and a second hole transport layer 17B.

The first light emitting unit 13A and the second light emitting unit 13B may employ any of various structures similar to those of conventionally-known organic EL elements and may have any laminated structure as long as they include light emitting layers made of at least an organic compound. For example, each of the first light emitting unit 13A and the second light emitting unit 13B may be configured such that an electron injection layer, a hole blocking layer, and the like are arranged on the first electrode 11 side of the light emitting layer and a hole injection layer, an electron blocking layer, and the like are arranged on the second electrode 12 side of the light emitting layer.

The first electron transport layer 15A and the second electron transport layer 15B are made of, for example, a conventionally well-known electron transport material. In the organic EL device 10 of the embodiment, an electron transport material with a relatively deep HOMO (Highest Occupied Molecular Orbital) level is preferably used among electron transport materials generally used for organic EL elements. Specifically, an electron transport material with a HOMO level of at least about 6.0 eV is preferably used. For example, 4,7-Diphenyl-1,10-phenanthroline (Bphen), 2,2', 2"-(1,3,5-Benzinetriyl)-tris(1-phenyl-1-H-benzimidazol e) (TPBi), and the like can be used as such an electron transport material.

Moreover, the first electron transport layer 15A and the second electron transport layer 15B may each be formed of a single layer or two or more layers.

At least one electron injection layer is provided between the first electrode 11 and the first electron transport layer 15A or between the first charge generating layer 14A and the second electron transport layer 15B to improve injection efficiency of electrons from at least one of the first electrode 11 and the first charge generating layer 14A. An electron transport material having properties similar to the electron transport layers can be used as the material of the electron injection layers. The electron transport layers and the electron injection layers are sometimes collectively referred to as electron transport layers.

The first hole transport layer 17A and the second hole transport layer 17B are made of, for example, a conventionally well-known hole transport material. The hole transport material is not limited to a particular material. For example, an organic compound (electron donating material) which has an ionization potential less than 5.7 eV and which has a hole transport property, that is an electron donating property is preferably used as the hole transport material. For example, an arylamine compound such as 4,4'-bis-[N-(2-naphthyl)-N-phenyl-amino]biphenyl (α-NPD) or the like can be used as the electron donating material.

At least one hole injection layer is provided between the second electrode 12 and the second hole transport layer 17B or between the first charge generating layer 14A and the first hole transport layer 17A to improve injection efficiency of holes from at least one of the second electrode 12 and the first charge generating layer 14A. An electron donating material having properties similar to the hole transport layers can be used as the material of the hole injection layers. The hole transport layer and the hole injection layer are sometimes collectively referred to as a hole transport layer.

The blue light emitting layer included in the first light emitting unit 13A is formed of a blue fluorescent light emitting layer containing a blue fluorescent material or a blue phosphorescent light emitting layer containing a blue phosphorescent material. Each blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layers included in the first light emitting unit 13A, a material with an electron transport property, a material with a hole transport property, a material obtained by mixing these materials, or the like can be used. In the blue fluorescent light emitting layers, for example, a styryl derivative, an anthracene compound, a pyrene compound, or the like can be used. Meanwhile, in the blue phosphorescent light emitting layer, for example, 4,4'-biscarbazolylbiphenyl (CBP), 2,9-dimethyl-4, 7-diphenyl-9,10-phenanthroline (BCP), or the like can be used.

The guest material of the first light emitting layer 16A included in the first light emitting unit 13A is also referred to as dopant material. The guest material utilizing fluorescent light emission is generally referred to as fluorescent light emitting material. A light emitting layer made of the fluorescent light emitting material is referred to as fluorescent light emitting layer. Meanwhile, the guest material utilizing phosphorescent light emission is generally referred to as phosphorescent light emitting material. A light emitting layer made of the phosphorescent light emitting material is referred to as phosphorescent light emitting layer.

In the phosphorescent light emitting layer out of these layers, it is possible to utilize not only 75% of triplet excitons, which are generated by recombination of electrons and holes, but also 25% of the triplet excitons, which are generated by energy transfer from singlet excitons. Accordingly, an internal quantum efficiency of 100% can be achieved in theory. Specifically, the excitons generated by the recombination of electrons and holes are converted to light in the light emitting layer without thermal quenching or the like. In an organic metal complex including heavy atoms such as iridium or platinum, an internal quantum efficiency close to 100% is actually achieved by optimization of the element structure and the like.

As the guest material of the blue phosphorescent light emitting layer, a blue phosphorescent light emitting material such as Ir(Fppy)$_3$ can be used.

As the guest material of the blue fluorescent light emitting layer, astyrylaminecompound, a fluoranthene compound, an aminopyrene compound, a boron complex, or the like can be used. Moreover, a material such as 4,4'-bis[4-(diphenylamino)styryl]biphenyl (BDAVBi), 2,7-bis{2-[phenyl(m-tolyl)amino]-9,9-dimethyl-fluoren-7-yl}-9,9-dimethyl-fluorene (MDP3FL) can be used.

When the second light emitting unit 13B is the red/green light emitting unit, the light emitting layer included in the second light emitting unit 13B is formed of either of the red phosphorescent light emitting layer or the red fluorescent light emitting layer and either of the green phosphorescent light emitting layer or the green fluorescent light emitting layer. Either of the red phosphorescent light emitting layer or the red fluorescent light emitting layer and either of the green phosphorescent light emitting layer or the green fluorescent light emitting layer each contain a host material which is a main component and a guest material which is a minor component as the organic compound. When the second light emitting unit 13B is the red-green light emitting unit, the light emitting layer included in the second light emitting unit 13B is formed of a mixed layer of either of the red phosphorescent material or the red fluorescent material and either of the green phosphorescent material or the green fluorescent material. The mixed layer of either of the red phosphorescent material or the red fluorescent material and either of the green phosphorescent material or the green fluorescent material contains a host material which is a main component and a guest material which is a minor component as the organic compound. Either of the red phosphorescent material or the red fluorescent material and either of the green phosphorescent material or the green fluorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light. This applies also to the case where the red fluorescent material and the green fluorescent material are used.

As the host material of the light emitting layer included in the second light emitting unit 13B, a material with an electron transport property, a material with a hole transport property, a material obtained by mixing these materials, or the like can be used. As the host material of the phosphorescent light emitting layer, specifically, for example, a material such as 4,4'-biscarbazolylbiphenyl (CBP) or 2,9-dimethyl-4,7-diphenyl-9,10-phenanthroline (BCP) can be used. As the host material of the fluorescent light emitting layer, for example, a material such as 4,4'-bis(2,2-diphenylvinyl)-1,1'-biphenyl (DPVBi) or tris(8-hydroxyquinolinato)aluminum (Alq$_3$) can be used.

The guest material of the phosphorescent light emitting layer is not limited to a particular material. For example, in the red phosphorescent light emitting layer, a red phosphorescent light emitting material such as Ir(piq)$_3$ and Ir (btpy)$_3$ can be used. Meanwhile, in the green phosphorescent light emitting layer, a green phosphorescent light emitting material such as Ir(ppy)$_3$ can be used.

The guest material of the fluorescent light emitting layer is not limited to a particular material. For example, in the red fluorescent light emitting layer, a red fluorescent light emitting material such as DCJTB can be used. Meanwhile, in the green fluorescent light emitting layer, a green fluorescent light emitting material such as coumarin 6 can be used.

For example, a vacuum deposition method, a spin coating method, or the like can be used as a film forming method of the layers forming the first light emitting unit 13A and the second light emitting unit 13B.

The charge generating layer 14A is formed of an electrically insulating layer made of an electron accepting material and an electron donating material. The specific resistance of the electrically insulating layer is preferably $1.0\times10^2$ Ω·cm or more, more preferably $1.0\times10^5$ Ω·cm or more.

Alternatively, the charge generating layer 14A may be configured such that the charge generating layer is formed of a mixed layer of different materials and one component of the mixed layer forms a charge transfer complex by redox. In this case, when voltage is applied between the first electrode 11 and the second electrode 12, charges in the charge transfer complex move to the first electrode 11 side and the second electrode 12 side. In the organic EL device 10, holes are thereby injected into the first light emitting unit 13A located on the first electrode 11 side of the charge generating layer 14A. Moreover, in the organic EL device 10, electrons are injected into the second light emitting unit 13B located on the second electrode 12 side of the charge generating layer 14A. Light can be thereby simultaneously emitted from the first light emitting unit 13A and the second light emitting unit 13B with the same current amount. Accordingly, a current efficiency and an external quantum efficiency proportionate to the sum of luminous efficiencies of the first light emitting unit 13A and the second light emitting unit 13B can be obtained.

Alternatively, the charge generating layer 14A may be a laminate of an electron accepting material and an electron donating material. In this case, when voltage is applied between the first electrode 11 and the second electrode 12, in an interface between the electron accepting material and the electron donating material, charges generated by reaction involving electron transfer between these electron accepting material and electron donating material move to the first electrode 11 side and the second electrode 12 side. In the organic EL device 10, holes are thereby injected into the first light emitting unit 13A located on the first electrode 11 side of the charge generating layer 14A. Moreover, in the organic EL device 10, electrons are injected into the second light emitting unit 13B located on the second electrode 12 side of the charge generating layer 14A. Light can be thereby simultaneously emitted from the first light emitting unit 13A and the second light emitting unit 13B with the same current amount. Accordingly, a current efficiency and an external quantum efficiency proportionate to the sum of luminous efficiencies of the first light emitting unit 13A and the second light emitting unit 13B can be obtained.

For example, materials described in Japanese Patent Application Publication No. 2003-272860 can be used as materials forming the charge generating layer 14A. Among these, materials described in paragraphs [0019] to [0021] can be preferably used. Alternatively, materials described in paragraphs [0023] to [0026] of "International Patent Application Publication No. WO2010/113493" can be used as materials forming the charge generating layer 14A. Among these, a strong electron accepting material (HATCN6) described in paragraphs [0059] in particular can be preferably used. When substituent groups represented by R in the structure expressed by the following formula (1) are CN (cyano groups), this compound is HATCN6 described above.

[Chem. 2]

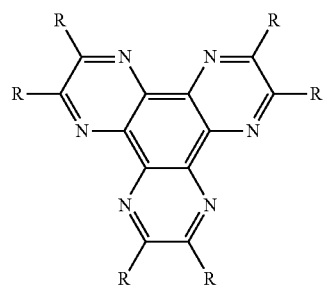

(1)

where R represents an electron withdrawing group of F, Cl, Br, I, CN, or $CF_3$.

In the organic EL device 10 having the aforementioned structure, the distribution characteristics of light emitted into the substrate 18 are such that the luminance of the white light takes the maximum in the angle range of 0 to 15 degrees with respect to the axis perpendicular to the plane direction of the substrate 18. Moreover, the spectral radiance at the maximum emission wavelength of the blue light takes the maximum in the angle range of 0 to 20 degrees with respect to the axis perpendicular to the plane direction of the substrate 18. Accordingly, it is possible to optimize the total luminous flux and provide white light with high color temperature and an excellent color rendering property.

Moreover, in the organic EL device 10 of the embodiment, the distribution characteristics of light emitted into the substrate 18 are such that the spectral radiance at the maximum emission wavelength of the blue light takes the local maximum in the angle range of 40 to 60 degrees with respect to the axis perpendicular to the plane direction of the substrate 18. Accordingly, it is possible to further optimize the total luminous flux and provide white light with higher color temperature and a better color rendering property.

The organic EL device 10 of the embodiment can provide white light with correlated color temperature of 3500 K or higher. Moreover, the organic EL device 10 can provide white light with the average color rendering index (Ra) of 70 or more.

As described above, the organic EL device 10 of the embodiment can provide white light with high color temperature and an excellent color rendering property. Moreover, the organic EL device 10 of the embodiment has the MPE structure in which the first light emitting unit 13A and the second light emitting unit 13B are stacked one on top of the other with the charge generating layer 14A sandwiched therebetween. Accordingly, the organic EL device 10 can provide the white light while achieving high-luminance light emission and long-life driving.

The organic EL device 10 of the embodiment can be thus preferably used in a display device and a lighting device.

Second Embodiment

Figure 2:
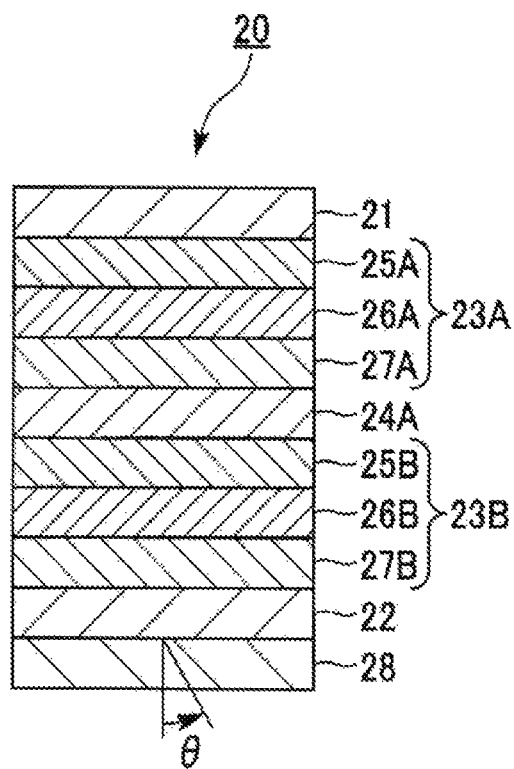
FIG. 2 is a cross-sectional view illustrating a schematic configuration of an organic EL device according to a second embodiment of the present invention.

FIG. 2 is a cross-sectional view illustrating a schematic configuration of an organic EL device according to a second embodiment of the present invention.

As illustrated in FIG. 2, the organic EL device 20 of the embodiment has a structure in which multiple light emitting units 23A, 23B each including a light emitting layer made of at least an organic compound are stacked one on top of the other between a first electrode 21 and a second electrode 22 with a charge generating layer (CGL) 24A sandwiched between the light emitting units 23A, 23B. The organic EL device 20 is an organic EL device capable of providing white light through a substrate 28 adjacent to the second electrode 22 by causing the multiple light emitting units 23A, 23B to emit light.

Note that the organic EL device 20 of the embodiment may be an organic EL device capable of providing white light through a substrate adjacent to the first electrode 21.

The first light emitting unit 23A is a red/green light emitting unit or a red-green light emitting unit. The red/green light emitting unit includes a light emitting layer formed of a red light emitting layer which emits red light with one maximum emission wavelength in a red wavelength band and a green light emitting layer which emits green light with one or two maximum emission wavelengths in a green wavelength band. Specifically, the red/green light emitting unit is a layer formed by stacking the red light emitting layer and the green light emitting layer one on top of the other. The red light emitting layer may be a red fluorescent light emitting layer containing a red fluorescent material or a red phosphorescent light emitting layer containing a red phosphorescent material. The green light emitting layer may be a green fluorescent light emitting layer containing a green fluorescent material or a green phosphorescent light emitting layer containing a green phosphorescent material. Meanwhile, the red-green light emitting unit includes a light emitting layer formed of a mixed layer of either of the red phosphorescent material or the red fluorescent material and either of the green phosphorescent material or the green fluorescent material. Specifically, the red-green light emitting unit is one layer (single layer) containing either of the red phosphorescent material or the red fluorescent material and either of the green phosphorescent material or the green fluorescent material. The red light and the green light provided by the red/green light emitting unit or the red-green light emitting unit may include a delayed fluorescence component.

The second light emitting unit 23B is a blue light emitting unit. The blue light emitting unit includes a light emitting layer formed of a blue light emitting layer which emits blue light with one or two maximum emission wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The white light provided by the organic EL device 20 of the embodiment is formed of the blue light emitted from the blue light emitting layer in the blue light emitting unit and the red light and the green light emitted from the red/green light emitting unit or the red-green light emitting unit.

The first light emitting unit 23A and the second light emitting unit 23B are stacked one on top of the other with the first charge generating layer 24A sandwiched therebetween.

The organic EL device 20 of the embodiment has a structure in which the substrate 28, the second electrode 22, the second light emitting unit 23B, the first charge generating layer 24A, the first light emitting unit 23A, and the first electrode 21 are stacked one on top of another in this order. Specifically, the organic EL device 20 of the embodiment has an MPE structure in which the first light emitting unit 23A and the second light emitting unit 23B are stacked one on top of the other with the first charge generating layer 24A sandwiched therebetween.

In the organic EL device 20 of the embodiment, the white light produced by light emission of the first light emitting unit 23A and the second light emitting unit 23B has an emission spectrum continuous over a wavelength band of at least 380 nm to 780 nm.

Distribution characteristics of light emitted into the substrate 28 are such that the luminance of the white light takes the maximum in an angle range of 0 to 15 degrees with respect to an axis perpendicular to a plane direction of the substrate 28.

When the luminance of the white light takes the maximum in a range above 15 degrees with respect to the axis perpendicular to the plane direction of the substrate 28, the luminance in an axial direction perpendicular to the plane direction of the substrate 28 is low and a sufficient luminance cannot be obtained in the case where the organic EL device 20 is used in a display device. Moreover, when an optical film such as a light extraction film is used, the optical film improves the total luminous flux value by extracting red and green light emission components which spread in wide-angle directions with respect to the axis perpendicular to the plane of the substrate 28. However, this causes decreases in the color temperature and the color rendering property.

Moreover, the organic EL device 20 of the embodiment has one or two maximum emission wavelengths in a blue wavelength band of 440 nm to 490 nm, one maximum emission wavelength in a red wavelength band of 590 nm to 640 nm, and one or two maximum emission wavelengths in a green wavelength band of 500 nm to 560 nm in the emission spectrum of the white light. These maximum emission wavelengths are based on the maximum emission wavelengths of the red light and the green light emitted from a first light emitting layer 26A in the first light emitting unit 23A and the blue light emitted from a blue light emitting layer (second light emitting layer 26B) in the second light emitting unit 23B.

When there is one maximum emission wavelength of the blue light, the light emission intensity of the blue light at this wavelength is higher than one of the light emission intensity at the maximum emission wavelength of the red light and the light emission intensity at the maximum emission wavelength of the green light. Meanwhile, when there are two maximum emission wavelengths of the blue light, the light emission intensity at the shorter maximum emission wavelength of the blue light is higher than one of the light emission intensity at the maximum emission wavelength of the red light and the light emission intensity at the maximum emission wavelength of the green light. As a result, the white light provided by the organic EL device 20 of the embodiment has high color temperature and has a color of pure white to blue white. Moreover, it is possible to improve the color rendering property while maintaining the color of pure white to blue white by reducing the light emission intensity at the maximum emission wavelength of the green light while maintaining the light emission intensity at the maximum emission wavelength of the blue light.

Accordingly, in the organic EL device 20 of the embodiment, the light emission intensity at the maximum emission wavelength of the blue light is important in obtaining suitable light emission characteristics.

In the organic EL device 20 of the embodiment, the distribution characteristics of light emitted into the substrate 28 are such that spectral radiance at the maximum emission wavelength of the blue light takes the maximum in an angle range of 0 to 20 degrees with respect to the axis perpendicular to the plane direction of the substrate 28. When the spectral radiance at the maximum emission wavelength of the blue light takes the maximum in a range above 20 degrees with respect to the axis perpendicular to the plane direction of the substrate 28, the amount of blue light emission component in the axial direction perpendicular to the plane direction of the substrate 28 decreases. Accordingly, the color temperature decreases and the organic EL device 20 is not suitable for use in the display device.

Moreover, in the organic EL device 20 of the embodiment, the distribution characteristics of light emitted into the substrate 28 are preferably such that the spectral radiance at the maximum emission wavelength of the blue light takes the local maximum in an angle range of 40 to 60 degrees with respect to the axis perpendicular to the plane direction of the substrate 28. When the spectral radiance at the maximum emission wavelength of the blue light takes the local maximum in a range below 40 degrees or above 60 degrees with respect to the axis perpendicular to the plane direction of the substrate 28, the blue light emission component cannot be efficiently extracted even if an optical film is used, and high color temperature cannot be thus achieved.

Meanwhile, the spectral radiance at the maximum emission wavelength of the red light and the spectral radiance at the maximum emission wavelength of the green light each take the maximum in an angle range of 0 to 20 degrees with respect to the axis perpendicular to the plane direction of the substrate 28. However, these maxima do not have that much effect on obtaining the suitable emission characteristics.

The same substrate as the substrate 18 in the aforementioned first embodiment can be used as the substrate 28.

The same electrode as the first electrode 11 in the aforementioned first embodiment can be used as the first electrode 21.

The same electrode as the second electrode 12 in the aforementioned first embodiment can be used as the second electrode 22.

The first light emitting unit 23A is formed of a first electron transport layer 25A, a first light emitting layer 26A, and a first hole transport layer 27A. The second light emitting unit 23B is formed of a second electron transport layer 25B, a second light emitting layer 26B, and a second hole transport layer 27B.

The first light emitting unit 23A and the second light emitting unit 23B may employ any of various structures similar to those of conventionally-known organic EL elements and may have any laminated structure as long as they include light emitting layers made of at least an organic compound. For example, each of the first light emitting unit 23A and the second light emitting unit 23B may be configured such that an electron injection layer, a hole blocking layer, and the like are arranged on the first electrode 21 side of the light emitting layer and a hole injection layer, an electron blocking layer, and the like are arranged on the second electrode 22 side of the light emitting layer.

The first electron transport layer 25A and the second electron transport layer 25B have the same configuration as that of the electron transport layers in the aforementioned first embodiment.

The hole transport layers have the same configuration as that of the hole transport layers in the aforementioned first embodiment.

When the first light emitting unit 23A is the red/green light emitting unit, the light emitting layer included in the first light emitting unit 23A is formed of either of the red phosphorescent light emitting layer or the red fluorescent light emitting layer and either of the green phosphorescent light emitting layer or the green fluorescent light emitting layer. Either of the red phosphorescent light emitting layer or the red fluorescent light emitting layer and either of the green phosphorescent light emitting layer or the green fluorescent light emitting layer each contain a host material which is a main component and a guest material which is a minor component as the organic compound. When the first light emitting unit 23A is the red-green light emitting unit, the light emitting layer included in the first light emitting unit 23A is formed of a mixed layer of either of the red phosphorescent material or the red fluorescent material and either of the green phosphorescent material or the green fluorescent material. The mixed layer of either of the red phosphorescent material or the red fluorescent material and either of the green phosphorescent material or the green fluorescent material contains a host material which is a main component and a guest material which is a minor component as the organic compound. Either of the red phosphorescent material or the red fluorescent material and either of the green phosphorescent material or the green fluorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light. This applies also to the case where the red fluorescent material and the green fluorescent material are used.

As the host material of the light emitting layer included in the first light emitting unit 23A, a material with an electron transport property, a material with a hole transport property, a material obtained by mixing these materials, or the like can be used. As the host material of the phosphorescent light emitting layer, specifically, for example, a material such as 4,4'-biscarbazolylbiphenyl (CBP) or 2,9-dimethyl-4,7-diphenyl-9,10-phenanthroline (BCP) can be used. As the host material of the fluorescent light emitting layer, for example, a material such as 4,4'-bis(2,2-diphenylvinyl)-1,1'-biphenyl (DPVBi) or tris(8-hydroxyquinolinato)aluminum ($Alq_3$) can be used.

The guest material of the phosphorescent light emitting layer is not limited to a particular material. For example, in the red phosphorescent light emitting layer, a red phosphorescent light emitting material such as $Ir(piq)_3$ and $Ir(btpy)_3$ can be used. Meanwhile, in the green phosphorescent light emitting layer, a green phosphorescent light emitting material such as $Ir(ppy)_3$ can be used.

The guest material of the fluorescent light emitting layer is not limited to a particular material. For example, in the red fluorescent light emitting layer, a red fluorescent light emitting material such as DCJTB can be used. Meanwhile, in the green fluorescent light emitting layer, a green fluorescent light emitting material such as coumarin 6 can be used.

The blue light emitting layer included in the second light emitting unit 23B is formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layer included in the second light emitting unit 23B, a material with an electron transport property, a material with a hole transport property, a material obtained by mixing these materials, or the like can be used. In the blue fluorescent light emitting layer, for example, a material such as a styryl derivative, an anthracene compound, a pyrene compound, or the like can be used. In the blue phosphorescent light emitting layer, for example, a material such as 4,4'-biscarbazolylbiphenyl (CBP) or 2,9-dimethyl-4,7-diphenyl-9,10-phenanthroline (BCP) can be used.

As the guest material of the blue phosphorescent light emitting layer, a blue phosphorescent light emitting material such as $Ir(Fppy)_3$ can be used.

As the guest material of the blue fluorescent light emitting layer, a material such as a styrylamine compound, a fluoranthene compound, an aminopyrene compound, or a boron complex can be used. Moreover, a material such as 4,4'-bis[4-(diphenylamino)styryl]biphenyl (BDAVBi) or 2,7-bis{2-[phenyl(m-tolyl)amino]-9,9-dimethyl-fluorene-7-yl}-9,9-dimethyl-fluorene (MDP3FL) can be used.

For example, a vacuum deposition method, a spin coating method, or the like can be used as a film forming method of the layers forming the first light emitting unit 23A and the second light emitting unit 23B.

The charge generating layer 24A is formed of an electrically insulating layer made of an electron accepting material and an electron donating material. The specific resistance of the electrically insulating layer is preferably $1.0 \times 10^2$ Ω·cm or more, more preferably $1.0 \times 10^5$ Ω·cm or more.

Alternatively, the charge generating layer 24A may be configured such that the charge generating layer is formed of a mixed layer of different materials and one component of the mixed layer forms a charge transfer complex by redox. In this case, when voltage is applied between the first electrode 21 and the second electrode 22, charges in the charge transfer complex move to the first electrode 21 side and the second electrode 22 side. In the organic EL device 20, holes are thereby injected into the first light emitting unit 23A located on the first electrode 21 side of the charge generating layer 24A. Moreover, in the organic EL device 20, electrons are injected into the second light emitting unit 23B located on the second electrode 22 side of the charge generating layer 24A. Light can be thereby simultaneously emitted from the first light emitting unit 23A and the second light emitting unit 23B with the same current amount. Accordingly, a current efficiency and an external quantum efficiency proportionate to the sum of luminous efficiencies of the first light emitting unit 23A and the second light emitting unit 23B can be obtained.

Alternatively, the charge generating layer 24A may be a laminate of an electron accepting material and an electron donating material. In this case, when voltage is applied between the first electrode 21 and the second electrode 22, in an interface between the electron accepting material and the electron donating material, charges generated by reaction involving electron transfer between these electron accepting material and electron donating material move to the first electrode 21 side and the second electrode 22 side. In the organic EL device 20, holes are thereby injected into the first light emitting unit 23A located on the first electrode 21 side of the charge generating layer 24A. Moreover, in the organic EL device 20, electrons are injected into the second light emitting unit 23B located on the second electrode 22 side of the charge generating layer 24A. Light can be thereby simultaneously emitted from the first light emitting unit 23A and the second light emitting unit 23B with the same current amount. Accordingly, a current efficiency and an external quantum efficiency proportionate to the sum of luminous efficiencies of the first light emitting unit 23A and the second light emitting unit 23B can be obtained.

As the material forming the charge generating layer 24A, the same material as that forming the charge generating layer 14A in the aforementioned first embodiment can be used.

In the organic EL device 20 having the aforementioned structure, the distribution characteristics of light emitted into the substrate 28 are such that the luminance of the white light takes the maximum in the angle range of 0 to 15 degrees with respect to the axis perpendicular to the plane direction of the substrate 28 and the spectral radiance at the maximum emission wavelength of the blue light takes the maximum in the angle range of 0 to 20 degrees with respect to the axis perpendicular to the plane direction of the substrate 28. Accordingly, it is possible to optimize the total luminous flux and provide white light with high color temperature and an excellent color rendering property.

Moreover, in the organic EL device 20 of the embodiment, the distribution characteristics of light emitted into the substrate 28 are such that the spectral radiance at the maximum emission wavelength of the blue light takes the local maximum in the angle range of 40 to 60 degrees with respect to the axis perpendicular to the plane direction of the substrate 28. Accordingly, it is possible to further optimize the total luminous flux and provide white light with higher color temperature and a better color rendering property.

The organic EL device 20 of the embodiment can provide white light with correlated color temperature of 3500 K or higher. Moreover, the organic EL device 20 can provide white light with the average color rendering index (Ra) of 70 or more.

As described above, the organic EL device 20 of the embodiment can provide white light with high color temperature and an excellent color rendering property. Moreover, the organic EL device 20 of the embodiment has the MPE structure in which the first light emitting unit 23A and the second light emitting unit 23B are stacked one on top of the other with the charge generating layer 24A sandwiched therebetween. Accordingly, the organic EL device 20 can provide the white light while achieving high-luminance light emission and long-life driving.

The organic EL device 20 of the embodiment can be thus preferably used in a display device and a lighting device.

Third Embodiment

Figure 3:
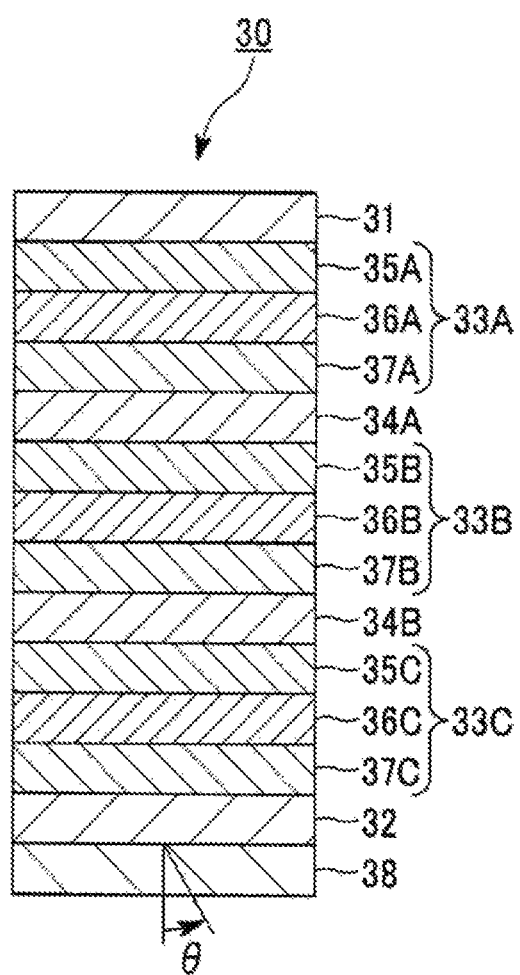
FIG. 3 is a cross-sectional view illustrating a schematic configuration of an organic EL device according to a third embodiment of the present invention.

FIG. 3 is a cross-sectional view illustrating a schematic configuration of an organic EL device according to a third embodiment of the present invention.

As illustrated in FIG. 3, the organic EL device 30 of the embodiment has a structure in which multiple light emitting units 33A, 33B, 33C each including a light emitting layer made of at least an organic compound are stacked one on top of another between a first electrode 31 and a second electrode 32 with each of charge generating layers (CGL) 34A, 34B sandwiched between a corresponding pair of adjacent light emitting units. The organic EL device 30 is an organic EL device capable of providing white light through a substrate 38 adjacent to the second electrode 32 by causing the multiple light emitting units 33A, 33B, 33C to emit light.

Note that the organic EL device 30 of the embodiment may be an organic EL device capable of providing white light through a substrate adjacent to the first electrode 31.

The first light emitting unit 33A is a red/green light emitting unit or a red-green light emitting unit. The red/green light emitting unit includes a light emitting layer formed of a red light emitting layer which emits red light with one maximum emission wavelength in a red wavelength band and a green light emitting layer which emits green light with one or two maximum emission wavelengths in a green wavelength band. Specifically, the red/green light emitting unit is a layer formed by stacking the red light emitting layer and the green light emitting layer one on top of the other. The red light emitting layer may be a red fluorescent light emitting layer containing a red fluorescent material or a red phosphorescent light emitting layer containing a red phosphorescent material. The green light emitting layer may be a green fluorescent light emitting layer containing a green fluorescent material or a green phosphorescent light emitting layer containing a green phosphorescent material. Meanwhile, the red-green light emitting unit includes a light emitting layer formed of a mixed layer of either of the red phosphorescent material or the red fluorescent material and either of the green phosphorescent material or the green fluorescent material. Specifically, the red-green light emitting unit is one layer (single layer) containing either of the red phosphorescent material or the red fluorescent material and either of the green phosphorescent material or the green fluorescent material. The red light and the green light provided by the red/green light emitting unit or the red-green light emitting unit may include a delayed fluorescence component.

The second light emitting unit 33B and the third light emitting unit 33C are each a blue light emitting unit. The blue light emitting unit includes a light emitting layer formed of a blue light emitting layer which emits blue light with one or two maximum emission wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The white light provided by the organic EL device 30 of the embodiment is formed of the blue light emitted from the blue light emitting layer in the blue light emitting unit and the red light and the green light emitted from the red/green light emitting unit or the red-green light emitting unit.

The first light emitting unit 33A and the second light emitting unit 33B are stacked one on top of the other with the first charge generating layer 34A sandwiched therebetween.

The second light emitting unit 33B and the third light emitting unit 33C are stacked one on top of the other with the second charge generating layer 34B sandwiched therebetween.

The organic EL device 30 of the embodiment has a structure in which the substrate 38, the second electrode 32, the third light emitting unit 33C, the second charge generating layer 34B, the second light emitting unit 33B, the first charge generating layer 34A, the first light emitting unit 33A, and the first electrode 31 are stacked one on top of another in this order. Specifically, the organic EL device 30 of the embodiment has an MPE structure in which the first light emitting unit 33A, the second light emitting unit 33B, and the third light emitting unit 33C are stacked one on top of another with each of the first charge generating layer 34A, and the second charge generating layer 34B sandwiched between the corresponding pair of adjacent light emitting units.

In the organic EL device 30 of the embodiment, the white light produced by light emission of the first light emitting unit 33A, the second light emitting unit 33B, and the third light emitting unit 33C has an emission spectrum continuous over a wavelength band of at least 380 nm to 780 nm.

Distribution characteristics of light emitted into the substrate 38 are such that the luminance of the white light takes the maximum in an angle range of 0 to 15 degrees with respect to an axis perpendicular to a plane direction of the substrate 38.

When the luminance of the white light takes the maximum in a range above 15 degrees with respect to the axis perpendicular to the plane direction of the substrate 38, the luminance in an axial direction perpendicular to the plane direction of the substrate 38 is low and sufficient luminance cannot be obtained in the case where the organic EL device 30 is used in a display device. Moreover, when an optical film such as a light extraction film is used, the optical film improves the total luminous flux value by extracting red and green light emission components which spread in wide-angle directions with respect to the axis perpendicular to the plane of the substrate 38. However, this causes decreases in the color temperature and the color rendering property.

Moreover, the organic EL device 30 of the embodiment has one or two maximum emission wavelengths in a blue wavelength band of 440 nm to 490 nm, one maximum emission wavelength in a red wavelength band of 590 nm to 640 nm, and one or two maximum emission wavelengths in a green wavelength band of 500 nm to 560 nm in the emission spectrum of the white light. These maximum emission wavelengths are based on the maximum emission wavelengths of the red light and the green light emitted from a first light emitting layer 36A in the first light emitting unit 33A and the blue light emitted from blue light emitting layers (second light emitting layer 36B, third light emitting layer 36C) in the second light emitting unit 33B and the third light emitting unit 33C.

When there is one maximum emission wavelength of the blue light, the light emission intensity of the blue light at this wavelength is higher than one of the light emission intensity at the maximum emission wavelength of the red light and the light emission intensity at the maximum emission wavelength of the green light. Meanwhile, when there are two maximum emission wavelengths of the blue light, the light emission intensity at the shorter maximum emission wavelength of the blue light is higher than one of the light emission intensity at the maximum emission wavelength of the red light and the light emission intensity at the maximum emission wavelength of the green light. As a result, the white light provided by the organic EL device 30 of the embodiment has high color temperature and has a color of pure white to blue white. Moreover, it is possible to improve the color rendering property while maintaining the color of pure white to blue white by reducing the light emission intensity at the maximum emission wavelength of the green light while maintaining the light emission intensity at the maximum emission wavelength of the blue light.

Accordingly, in the organic EL device 30 of the embodiment, the light emission intensity at the maximum emission wavelength of the blue light is important in obtaining suitable light emission characteristics.

In the organic EL device 30 of the embodiment, the distribution characteristics of light emitted into the substrate 38 are such that spectral radiance at the maximum emission wavelength of the blue light takes the maximum in an angle range of 0 to 20 degrees with respect to the axis perpendicular to the plane direction of the substrate 38. When the spectral radiance at the maximum emission wavelength of the blue light takes the maximum in a range above 20 degrees with respect to the axis perpendicular to the plane direction of the substrate 38, the amount of blue light emission component in the axial direction perpendicular to the plane direction of the substrate 38 decreases. Accordingly, the color temperature decreases and the organic EL device 30 is not suitable for use in the display device.

Moreover, in the organic EL device 30 of the embodiment, the distribution characteristics of light emitted into the substrate 38 are preferably such that the spectral radiance at the maximum emission wavelength of the blue light takes the local maximum in an angle range of 40 to 60 degrees with respect to the axis perpendicular to the plane direction of the substrate 38. When the spectral radiance at the maximum emission wavelength of the blue light takes the local maximum in a range below 40 degrees or above 60 degrees with respect to the axis perpendicular to the plane direction of the substrate 38, the blue light emission component cannot be efficiently extracted even if an optical film is used, and high color temperature cannot be thus achieved.

Meanwhile, the spectral radiance at the maximum emission wavelength of the red light and the spectral radiance at the maximum emission wavelength of the green light each take the maximum in an angle range of 0 to 20 degrees with respect to the axis perpendicular to the plane direction of the substrate 38. However, these maxima do not have that much effect on obtaining the suitable emission characteristics.

The same substrate as the substrate 18 in the aforementioned first embodiment can be used as the substrate 38.

The same electrode as the first electrode 11 in the aforementioned first embodiment can be used as the first electrode 31.

The same electrode as the second electrode 12 in the aforementioned first embodiment can be used as the second electrode 32.

The first light emitting unit 33A is formed of a first electron transport layer 35A, a first light emitting layer 36A, and a first hole transport layer 37A. The second light emitting unit 33B is formed of a second electron transport layer 35B, a second light emitting layer 36B, and a second hole transport layer 37B. The third light emitting unit 33C is formed of a third electron transport layer 35C, a third light emitting layer 36C, and a third hole transport layer 37C.

The first light emitting unit 33A, the second light emitting unit 33B, and the third light emitting unit 33C may employ any of various structures similar to those of conventionally-known organic EL elements and may have any laminated structure as long as they include light emitting layers made of at least an organic compound. For example, each of the first light emitting unit 33A, the second light emitting unit 33B, and the third light emitting unit 33C may be configured such that an electron injection layer, a hole blocking layer, and the like are arranged on the first electrode 31 side of the light emitting layer and a hole injection layer, an electron blocking layer, and the like are arranged on the second electrode 32 side of the light emitting layer.

The first electron transport layer 35A, the second electron transport layer 35B, and the third electron transport layer 35C have the same configuration as that of the electron transport layers in the aforementioned first embodiment.

The hole transport layers have the same configuration as that of the hole transport layers in the aforementioned first embodiment.

When the first light emitting unit 33A is the red/green light emitting unit, the light emitting layer included in the first light emitting unit 33A is formed of either of the red phosphorescent light emitting layer or the red fluorescent light emitting layer and either of the green phosphorescent light emitting layer or the green fluorescent light emitting layer. Either of the red phosphorescent light emitting layer or the red fluorescent light emitting layer and either of the green phosphorescent light emitting layer or the green fluorescent light emitting layer each contain a host material which is a main component and a guest material which is a minor component as the organic compound. When the first light emitting unit 33A is the red-green light emitting unit, the light emitting layer included in the first light emitting unit 33A is formed of a mixed layer of either of the red phosphorescent material or the red fluorescent material and either of the green phosphorescent material or the green fluorescent material. The mixed layer of either of the red phosphorescent material or the red fluorescent material and either of the green phosphorescent material or the green fluorescent material contains a host material which is a main component and a guest material which is a minor component as the organic compound. Either of the red phosphorescent material or the red fluorescent material and either of the green phosphorescent material or the green fluorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light. This applies also to the case where the red fluorescent material and the green fluorescent material are used.

As the host material of the light emitting layer included in the first light emitting unit 33A, a material with an electron transport property, a material with a hole transport property, a material obtained by mixing these materials, or the like can be used. As the host material of the phosphorescent light emitting layer, specifically, for example, a material such as 4,4'-biscarbazolylbiphenyl (CBP) or 2,9-dimethyl-4,7-diphenyl-9,10-phenanthroline (BCP) can be used. As the host material of the fluorescent light emitting layer, for example, a material such as 4,4'-bis(2,2-diphenylvinyl)-1,1'-biphenyl (DPVBi) or tris(8-hydroxyquinolinato)aluminum ($Alq_3$) can be used.

The guest material of the phosphorescent light emitting layer is not limited to a particular material. For example, in the red phosphorescent light emitting layer, a red phosphorescent light emitting material such as $Ir(piq)_3$ and $Ir(btpy)_3$ can be used. Meanwhile, in the green phosphorescent light emitting layer, a green phosphorescent light emitting material such as $Ir(ppy)_3$ can be used.

The guest material of the fluorescent light emitting layer is not limited to a particular material. For example, in the red fluorescent light emitting layer, a red fluorescent light emitting material such as DCJTB can be used. Meanwhile, in the green fluorescent light emitting layer, a green fluorescent light emitting material such as coumarin 6 can be used.

The blue light emitting layers included in the second light emitting unit 33B and the third light emitting unit 33C are each formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layers included in the second light emitting unit 33B and the third light emitting unit 33C, a material with an electron transport property, a material with a hole transport property, a material obtained by mixing these materials, or the like can be used. In the blue fluorescent light emitting layer, for example, a material such as a styryl derivative, an anthracene compound, a pyrene compound, or the like can be used. In the blue phosphorescent light emitting layer, for example, a material such as 4,4'-biscarbazolylbiphenyl (CBP) or 2,9-dimethyl-4,7-diphenyl-9,10-phenanthroline (BCP) can be used.

As the guest material of the blue phosphorescent light emitting layer, a blue phosphorescent light emitting material such as $Ir(Fppy)_3$ can be used.

As the guest material of the blue fluorescent light emitting layer, a material such as a styrylamine compound, a fluoranthene compound, an aminopyrene compound, or a boron complex can be used. Moreover, a material such as 4,4'-bis[4-(diphenylamino)styryl]biphenyl (BDAVBi) or 2,7-bis{2-[phenyl(m-tolyl)amino]-9,9-dimethyl-fluorene-7-yl}-9,9-dimethyl-fluorene (MDP3FL) can be used.

For example, a vacuum deposition method, a spin coating method, or the like can be used as a film forming method of the layers forming the first light emitting unit 33A, the second light emitting unit 33B, and the third light emitting unit 33C.

The first charge generating layer 34A and the second charge generating layer 34B are each formed of an electrically insulating layer made of an electron accepting material and an electron donating material. The specific resistance of the electrically insulating layer is preferably $1.0 \times 10^2$ Ω·cm or more, more preferably $1.0 \times 10^5$ Ω·cm or more.

Alternatively, the first charge generating layer 34A, and the second charge generating layer 34B may each be configured such that the charge generating layer is formed of a mixed layer of different materials and one component of the mixed layer forms a charge transfer complex by redox. In this case, when voltage is applied between the first electrode 31 and the second electrode 32, charges in the charge transfer complex move to the first electrode 31 side and the second electrode 32 side. In the organic EL device 30, holes are thereby injected into the second light emitting unit 33B located on the first electrode 31 side of the second charge generating layer 34B and the first light emitting unit 33A located on the first electrode 31 side of the first charge generating layer 34A. Moreover, in the organic EL device 30, electrons are injected into the third light emitting unit 33C located on the second electrode 32 side of the second charge generating layer 34B, and the second light emitting unit 33B located on the second electrode 32 side of the first charge generating layer 34A. Light can be thereby simultaneously emitted from the first light emitting unit 33A, the second light emitting unit 33B, and the third light emitting unit 33C with the same current amount. Accordingly, a current efficiency and an external quantum efficiency proportionate to the sum of luminous efficiencies of the first light emitting unit 33A, the second light emitting unit 33B, and the third light emitting unit 33C can be obtained.

Alternatively, the first charge generating layer 34A and the second charge generating layer 34B may each be a laminate of an electron accepting material and an electron donating material. In this case, when voltage is applied between the first electrode 31 and the second electrode 32, in an interface between the electron accepting material and the electron donating material, charges generated by reaction involving electron transfer between these electron accepting material and electron donating material move to the first electrode 31 side and the second electrode 32 side. In the organic EL device 30, holes are thereby injected into the second light emitting unit 33B located on the first electrode 31 side of the second charge generating layer 34B and the first light emitting unit 33A located on the first electrode 31 side of the first charge generating layer 34A. Moreover, in the organic EL device 30, electrons are injected into the third light emitting unit 33C located on the second electrode 32 side of the second charge generating layer 34B and the second light emitting unit 33B located on the second electrode 32 side of the first charge generating layer 34A. Light can be thereby simultaneously emitted from the first light emitting unit 33A, the second light emitting unit 33B, and the third light emitting unit 33C with the same current amount. Accordingly, a current efficiency and an external quantum efficiency proportionate to the sum of luminous efficiencies of the first light emitting unit 33A, the second light emitting unit 33B, and the third light emitting unit 33C can be obtained.

As materials forming the first charge generating layer 34A and the second charge generating layer 34B, the same materials as the materials forming the charge generating layer 14A in the aforementioned first embodiment can be used.

In the organic EL device 30 having the aforementioned structure, the distribution characteristics of light emitted into the substrate 38 are such that the luminance of the white light takes the maximum in the angle range of 0 to 15 degrees with respect to the axis perpendicular to the plane direction of the substrate 38. Moreover, the spectral radiance at the maximum emission wavelength of the blue light takes the maximum in the angle range of 0 to 20 degrees with respect to the axis perpendicular to the plane direction of the substrate 38. Accordingly, it is possible to optimize the total luminous flux and provide white light with high color temperature and an excellent color rendering property.

Moreover, in the organic EL device 30 of the embodiment, the distribution characteristics of light emitted into the substrate 38 are such that the spectral radiance at the maximum emission wavelength of the blue light takes the local maximum in the angle range of 40 to 60 degrees with respect to the axis perpendicular to the plane direction of the substrate 38. Accordingly, it is possible to further optimize the total luminous flux and provide white light with higher color temperature and a better color rendering property.

The organic EL device 30 of the embodiment can provide white light with correlated color temperature of 3500 K or higher. Moreover, the organic EL device 30 can provide white light with the average color rendering index (Ra) of 70 or more.

As described above, the organic EL device 30 of the embodiment can provide white light with high color temperature and an excellent color rendering property. Moreover, the organic EL device 30 of the embodiment has the MPE structure in which the first light emitting unit 33A, the second light emitting unit 33B, and the third light emitting unit 33C are stacked one on top of another with each of the first charge generating layer 34A and the second charge generating layer 34B sandwiched between the corresponding pair of adjacent light emitting units. Accordingly, the organic EL device 30 can provide the white light while achieving high-luminance light emission and long-life driving.

The organic EL device 30 of the embodiment can be thus preferably used in a display device and a lighting device.

Fourth Embodiment

Figure 4:
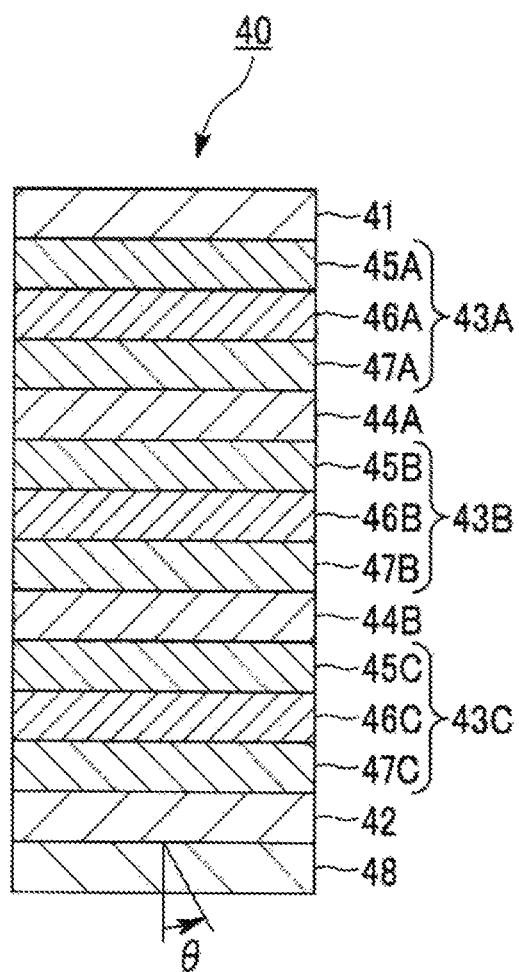
FIG. 4 is a cross-sectional view illustrating a schematic configuration of an organic EL device according to a fourth embodiment of the present invention.

FIG. 4 is a cross-sectional view illustrating a schematic configuration of an organic EL device according to a fourth embodiment of the present invention.

As illustrated in FIG. 4, the organic EL device 40 of the embodiment has a structure in which multiple light emitting units 43A, 43B, 43C each including a light emitting layer made of at least an organic compound are stacked one on top of another between a first electrode 41 and a second electrode 42 with each of charge generating layers (CGL) 44A, 44B sandwiched between a corresponding pair of adjacent light emitting units. The organic EL device 40 is an organic EL device capable of providing white light through a substrate 48 adjacent to the second electrode 42 by causing the multiple light emitting units 43A, 43B, 43C to emit light.

Note that the organic EL device 40 of the embodiment may be an organic EL device capable of providing white light through a substrate adjacent to the first electrode 41.

The first light emitting unit 43A and the third light emitting unit 43C are each a blue light emitting unit. The blue light emitting unit includes a light emitting layer formed of a blue light emitting layer which emits blue light with one or two maximum emission wavelengths in a blue wavelength band. The blue light emitting layer may be a blue fluorescent light emitting layer containing a blue fluorescent material or a blue phosphorescent light emitting layer containing a blue phosphorescent material. The blue light provided by the blue light emitting unit including the blue fluorescent light emitting layer may include a delayed fluorescence component.

The second light emitting unit 43B is a red/green light emitting unit or a red-green light emitting unit. The red/green light emitting unit includes a light emitting layer formed of a red light emitting layer which emits red light with one maximum emission wavelength in a red wavelength band and a green light emitting layer which emits green light with one or two maximum emission wavelengths in a green wavelength band. Specifically, the red/green light emitting unit is a layer formed by stacking the red light emitting layer and the green light emitting layer one on top of the other. The red light emitting layer may be a red fluorescent light emitting layer containing a red fluorescent material or a red phosphorescent light emitting layer containing a red phosphorescent material. The green light emitting layer may be a green fluorescent light emitting layer containing a green fluorescent material or a green phosphorescent light emitting layer containing a green phosphorescent material. Meanwhile, the red-green light emitting unit includes a light emitting layer formed of a mixed layer of either of the red phosphorescent material or the red fluorescent material and either of the green phosphorescent material or the green fluorescent material. Specifically, the red-green light emitting unit is one layer (single layer) containing either of the red phosphorescent material or the red fluorescent material and either of the green phosphorescent material or the green fluorescent material. The red light and the green light provided by the red/green light emitting unit or the red-green light emitting unit may include a delayed fluorescence component.

The white light provided by the organic EL device 40 of the embodiment is formed of the blue light emitted from the blue light emitting layer in the blue light emitting unit and the red light and the green light emitted from the red/green light emitting unit or the red-green light emitting unit.

The first light emitting unit 43A and the second light emitting unit 43B are stacked one on top of the other with the first charge generating layer 44A sandwiched therebetween.

The second light emitting unit 43B and the third light emitting unit 43C are stacked one on top of the other with the second charge generating layer 44B sandwiched therebetween.

The organic EL device 40 of the embodiment has a structure in which the substrate 48, the second electrode 42, the third light emitting unit 43C, the second charge generating layer 44B, the second light emitting unit 43B, the first charge generating layer 44A, the first light emitting unit 43A, and the first electrode 41 stacked one on top of another in this order. Specifically, the organic EL device 40 of the embodiment has an MPE structure in which the first light emitting unit 43A, the second light emitting unit 43B, and the third light emitting unit 43C are stacked one on top of another with each of the first charge generating layer 44A and the second charge generating layer 44B sandwiched between the corresponding pair of adjacent light emitting units.

In the organic EL device 40 of the embodiment, the white light produced by light emission of the first light emitting unit 43A, the second light emitting unit 43B, and the third light emitting unit 43C has an emission spectrum continuous over a wavelength band of at least 380 nm to 780 nm.

Distribution characteristics of light emitted into the substrate 48 are such that the luminance of the white light takes the maximum in an angle range of 0 to 15 degrees with respect to an axis perpendicular to a plane direction of the substrate 48.

When the luminance of the white light takes the maximum in a range above 15 degrees with respect to the axis perpendicular to the plane direction of the substrate 48, the luminance in an axial direction perpendicular to the plane direction of the substrate 48 is low and sufficient luminance cannot be obtained in the case where the organic EL device 40 is used in a display device. Moreover, when an optical film such as a light extraction film is used, the optical film improves the total luminous flux value by extracting red and green light emission components which spread in wide-angle directions with respect to the axis perpendicular to the plane of the substrate 48. However, this causes decreases in the color temperature and the color rendering property.

Moreover, the organic EL device 40 of the embodiment has one or two maximum emission wavelengths in a blue wavelength band of 440 nm to 490 nm, one maximum emission wavelength in a red wavelength band of 590 nm to 640 nm, and one or two maximum emission wavelengths in a green wavelength band of 500 nm to 560 nm in the emission spectrum of the white light. These maximum emission wavelengths are based on the maximum emission wavelengths of the blue light emitted from blue light emitting layers (first light emitting layer 46A, third light emitting layer 46C) in the first light emitting unit 43A and the third light emitting unit 43C and the red light and the green light emitted from a second light emitting layer 46B in the second light emitting unit 43B.

When there is one maximum emission wavelength of the blue light, the light emission intensity of the blue light at this wavelength is higher than one of the light emission intensity at the maximum emission wavelength of the red light and the light emission intensity at the maximum emission wavelength of the green light. Meanwhile, when there are two maximum emission wavelengths of the blue light, the light emission intensity at the shorter maximum emission wavelength of the blue light is higher than one of the light emission intensity at the maximum emission wavelength of the red light and the light emission intensity at the maximum emission wavelength of the green light. As a result, the white light provided by the organic EL device 40 of the embodiment has high color temperature and has a color of pure white to blue white. Moreover, it is possible to improve the color rendering property while maintaining the color of pure white to blue white by reducing the light emission intensity at the maximum emission wavelength of the green light while maintaining the light emission intensity at the maximum emission wavelength of the blue light.

Accordingly, in the organic EL device 40 of the embodiment, the light emission intensity at the maximum emission wavelength of the blue light is important in obtaining suitable light emission characteristics.

In the organic EL device 40 of the embodiment, the distribution characteristics of light emitted into the substrate 48 are such that spectral radiance at the maximum emission wavelength of the blue light takes the maximum in an angle range of 0 to 20 degrees with respect to the axis perpendicular to the plane direction of the substrate 48. When the spectral radiance at the maximum emission wavelength of the blue light takes the maximum in a range above 20 degrees with respect to the axis perpendicular to the plane direction of the substrate 48, the amount of blue light emission component in the axial direction perpendicular to the plane direction of the substrate 48 decreases. Accordingly, the color temperature decreases and the organic EL device 40 is not suitable for use in the display device.

Moreover, in the organic EL device 40 of the embodiment, the distribution characteristics of light emitted into the substrate 48 are preferably such that the spectral radiance at the maximum emission wavelength of the blue light takes the local maximum in an angle range of 40 to 60 degrees with respect to the axis perpendicular to the plane direction of the substrate 48. When the spectral radiance at the maximum emission wavelength of the blue light takes the local maximum in a range below 40 degrees or above 60 degrees with respect to the axis perpendicular to the plane direction of the substrate 48, the blue light emission component cannot be efficiently extracted even if an optical film is used, and high color temperature cannot be thus achieved.

Meanwhile, the spectral radiance at the maximum emission wavelength of the red light and the spectral radiance at the maximum emission wavelength of the green light each take the maximum in an angle range of 0 to 20 degrees with respect to the axis perpendicular to the plane direction of the substrate 48. However, these maxima do not have that much effect on obtaining the suitable emission characteristics.

The same substrate as the substrate 18 in the aforementioned first embodiment can be used as the substrate 48.

The same electrode as the first electrode 11 in the aforementioned first embodiment can be used as the first electrode 41.

The same electrode as the second electrode 12 in the aforementioned first embodiment can be used as the second electrode 42.

The first light emitting unit 43A is formed of a first electron transport layer 45A, a first light emitting layer 46A, and a first hole transport layer 47A. The second light emitting unit 43B is formed of a second electron transport layer 45B, a second light emitting layer 46B, and a second hole transport layer 47B. The third light emitting unit 43C is formed of a third electron transport layer 45C, a third light emitting layer 46C, and a third hole transport layer 47C.

The first light emitting unit 43A, the second light emitting unit 43B, and the third light emitting unit 43C may employ any of various structures similar to those of conventionally-known organic EL elements and may have any laminated structure as long as they include light emitting layers made of at least an organic compound. For example, each of the first light emitting unit 43A, the second light emitting unit 43B, and the third light emitting unit 43C may be configured such that an electron injection layer, a hole blocking layer, and the like are arranged on the first electrode 41 side of the light emitting layer and a hole injection layer, an electron blocking layer, and the like are arranged on the second electrode 42 side of the light emitting layer.

The first electron transport layer 45A, the second electron transport layer 45B, and the third electron transport layer 45C have the same configuration as that of the electron transport layers in the aforementioned first embodiment.

The hole transport layers have the same configuration as that of the hole transport layers in the aforementioned first embodiment.

The blue light emitting layers included in the first light emitting unit 43A and the third light emitting unit 43C are each formed of a blue fluorescent light emitting layer containing a blue fluorescent material or a blue phosphorescent light emitting layer containing a blue phosphorescent material. The blue light emitting layer contains a host material which is a main component and a guest material which is a minor component as the organic compound. The blue fluorescent material or the blue phosphorescent material corresponds to the guest material out of these materials. In either case, emission of the blue light is attributable particularly to the properties of the guest material.

As the host material of the blue light emitting layers included in the first light emitting unit 43A and the third light emitting unit 43C, a material with an electron transport property, a material with a hole transport property, a material obtained by mixing these materials, or the like can be used. In the blue fluorescent light emitting layer, for example, a material such as a styryl derivative, an anthracene compound, a pyrene compound, or the like can be used. In the blue phosphorescent light emitting layer, for example, a material such as 4,4'-biscarbazolylbiphenyl (CBP) or 2,9-dimethyl-4,7-diphenyl-9,10-phenanthroline (BCP) can be used.

As the guest material of the blue phosphorescent light emitting layer, a blue phosphorescent light emitting material such as Ir(Fppy)$_3$ can be used.

As the guest material of the blue fluorescent light emitting layer, a material such as a styrylamine compound, a fluoranthene compound, an aminopyrene compound, or a boron complex can be used. Moreover, a material such as 4,4'-bis[4-(diphenylamino)styryl]biphenyl (BDAVBi) or 2,7-bis{2-[phenyl(m-tolyl)amino]-9,9-dimethyl-fluorene-7-yl}-9,9-dimethyl-fluorene (MDP3FL) can be used.

When the second light emitting unit 43B is the red/green light emitting unit, the light emitting layer included in the second light emitting unit 43B is formed of either of the red phosphorescent light emitting layer or the red fluorescent light emitting layer and either of the green phosphorescent light emitting layer or the green fluorescent light emitting layer. Either of the red phosphorescent light emitting layer or the red fluorescent light emitting layer and either of the green phosphorescent light emitting layer or the green fluorescent light emitting layer each contain a host material which is a main component and a guest material which is a minor component as the organic compound. When the second light emitting unit 43B is the red-green light emitting unit, the light emitting layer included in the second light emitting unit 43B is formed of a mixed layer of either of the red phosphorescent material or the red fluorescent material and either of the green phosphorescent material or the green fluorescent material. The mixed layer of either of the red phosphorescent material or the red fluorescent material and either of the green phosphorescent material or the green fluorescent material contains a host material which is a main component and a guest material which is a minor component as the organic compound. Either of the red phosphorescent material or the red fluorescent material and either of the green phosphorescent material or the green fluorescent material correspond to the guest material out of these materials. In either case, emission of the red light and the green light is attributable particularly to the properties of the guest material. Moreover, when the light emitting layer is formed of the mixed layer of the red phosphorescent material and the green phosphorescent material, it is important that light is efficiently emitted from both light emitting materials. To achieve this, it is effective to set the proportion of the red phosphorescent material lower than the proportion of the green phosphorescent material. This is due to the following reason. Since the energy level of the red phosphorescent material is lower than the energy level of the green phosphorescent material, energy transfer to the red phosphorescent material is more likely to occur. Accordingly, setting the proportion of the red phosphorescent material lower than the proportion of the green phosphorescent material allows both of the red phosphorescent material and the green phosphorescent material to efficiently emit light. This applies also to the case where the red fluorescent material and the green fluorescent material are used.

As the host material of the light emitting layer included in the second light emitting unit 43B, a material with an electron transport property, a material with a hole transport property, a material obtained by mixing these materials, or the like can be used. As the host material of the phosphorescent light emitting layer, specifically, for example, a material such as 4,4'-biscarbazolylbiphenyl (CBP) or 2,9-dimethyl-4,7-diphenyl-9,10-phenanthroline (BCP) can be used. As the host material of the fluorescent light emitting layer, for example, a material such as 4,4'-bis(2,2-diphenyl-vinyl)-1,1'-biphenyl (DPVBi) or tris(8-hydroxyquinolinato) aluminum ($Alq_3$) can be used.

The guest material of the phosphorescent light emitting layer is not limited to a particular material. For example, in the red phosphorescent light emitting layer, a red phosphorescent light emitting material such as $Ir(piq)_3$ and $Ir(btpy)_3$ can be used. Meanwhile, in the green phosphorescent light emitting layer, a green phosphorescent light emitting material such as $Ir(ppy)_3$ can be used.

The guest material of the fluorescent light emitting layer is not limited to a particular material. For example, in the red fluorescent light emitting layer, a red fluorescent light emitting material such as DCJTB can be used. Meanwhile, in the green fluorescent light emitting layer, a green fluorescent light emitting material such as coumarin 6 can be used.

For example, a vacuum deposition method, a spin coating method, or the like can be used as a film forming method of the layers forming the first light emitting unit 43A, the second light emitting unit 43B, and the third light emitting unit 43C.

The first charge generating layer 44A and the second charge generating layer 44B are each formed of an electrically insulating layer made of an electron accepting material and an electron donating material. The specific resistance of the electrically insulating layer is preferably $1.0 \times 10^2$ Ω·cm or more, more preferably $1.0 \times 10^5$ Ω·cm or more.

Alternatively, the first charge generating layer 44A and the second charge generating layer 44B may each be configured such that the charge generating layer is formed of a mixed layer of different materials and one component of the mixed layer forms a charge transfer complex by redox. In this case, when voltage is applied between the first electrode 41 and the second electrode 42, charges in the charge transfer complex move to the first electrode 41 side and the second electrode 42 side. In the organic EL device 40, holes are thereby injected into the second light emitting unit 43B located on the first electrode 41 side of the second charge generating layer 44B, and the first light emitting unit 43A located on the first electrode 41 side of the first charge generating layer 44A. Moreover, in the organic EL device 40, electrons are injected into the third light emitting unit 43C located on the second electrode 42 side of the second charge generating layer 44B, and the second light emitting unit 43B located on the second electrode 42 side of the first charge generating layer 44A. Light can be thereby simultaneously emitted from the first light emitting unit 43A, the second light emitting unit 43B, and the third light emitting unit 43C with the same current amount. Accordingly, a current efficiency and an external quantum efficiency proportionate to the sum of luminous efficiencies of the first light emitting unit 43A, the second light emitting unit 43B, and the third light emitting unit 43C can be obtained.

Alternatively, the first charge generating layer 44A and the second charge generating layer 44B may each be a laminate of an electron accepting material and an electron donating material. In this case, when voltage is applied between the first electrode 41 and the second electrode 42, in an interface between the electron accepting material and the electron donating material, charges generated by reaction involving electron transfer between these electron accepting material and electron donating material move to the first electrode 41 side and the second electrode 42 side. In the organic EL device 40, holes are thereby injected into the second light emitting unit 43B located on the first electrode 41 side of the second charge generating layer 44B and the first light emitting unit 43A located on the first electrode 41 side of the first charge generating layer 44A. Moreover, in the organic EL device 40, electrons are injected into the third light emitting unit 43C located on the second electrode 42 side of the second charge generating layer 44B and the second light emitting unit 43B located on the second electrode 42 side of the first charge generating layer 44A. Light can be thereby simultaneously emitted from the first light emitting unit 43A, the second light emitting unit 43B, and the third light emitting unit 43C with the same current amount. Accordingly, a current efficiency and an external quantum efficiency proportionate to the sum of luminous efficiencies of the first light emitting unit 43A, the second light emitting unit 43B, and the third light emitting unit 43C can be obtained.

As the material forming the first charge generating layer 44A and the second charge generating layer 44B, the same material as that forming the charge generating layer 14A in the aforementioned first embodiment can be used.

In the organic EL device 40 having the aforementioned structure, the distribution characteristics of light emitted into the substrate 48 are such that the luminance of the white light takes the maximum in the angle range of 0 to 15 degrees with respect to the axis perpendicular to the plane direction of the substrate 48 and the spectral radiance at the maximum emission wavelength of the blue light takes the maximum in the angle range of 0 to 20 degrees with respect to the axis perpendicular to the plane direction of the substrate 48. Accordingly, it is possible to optimize the total luminous flux and provide white light with high color temperature and an excellent color rendering property.

Moreover, in the organic EL device 40 of the embodiment, the distribution characteristics of light emitted into the substrate 48 are such that the spectral radiance at the maximum emission wavelength of the blue light takes the local maximum in the angle range of 40 to 60 degrees with respect to the axis perpendicular to the plane direction of the substrate 48. Accordingly, it is possible to further optimize the total luminous flux and provide white light with higher color temperature and a better color rendering property.

The organic EL device 40 of the embodiment can provide white light with correlated color temperature of 3500 K or higher. Moreover, the organic EL device 40 can provide white light with the average color rendering index (Ra) of 70 or more.

As described above, the organic EL device 40 of the embodiment can provide white light with high color temperature and an excellent color rendering property. Moreover, the organic EL device 40 of the embodiment has the MPE structure in which the first light emitting unit 43A, the second light emitting unit 43B, and the third light emitting unit 43C are stacked one on top of another with each of the first charge generating layer 44A and the second charge generating layer 44B sandwiched between the corresponding pair of adjacent light emitting units. Accordingly, the organic EL device 40 can provide the white light while achieving high-luminance light emission and long-life driving.

The organic EL device 40 of the embodiment can be thus preferably used in a display device and a lighting device.

Note that the organic EL devices 10, 20, 30, 40 may have a configuration including optical films for improving the emission efficiency, on light extraction surfaces of the substrates 18, 28, 38, 48.

Fifth Embodiment

Figure 5:
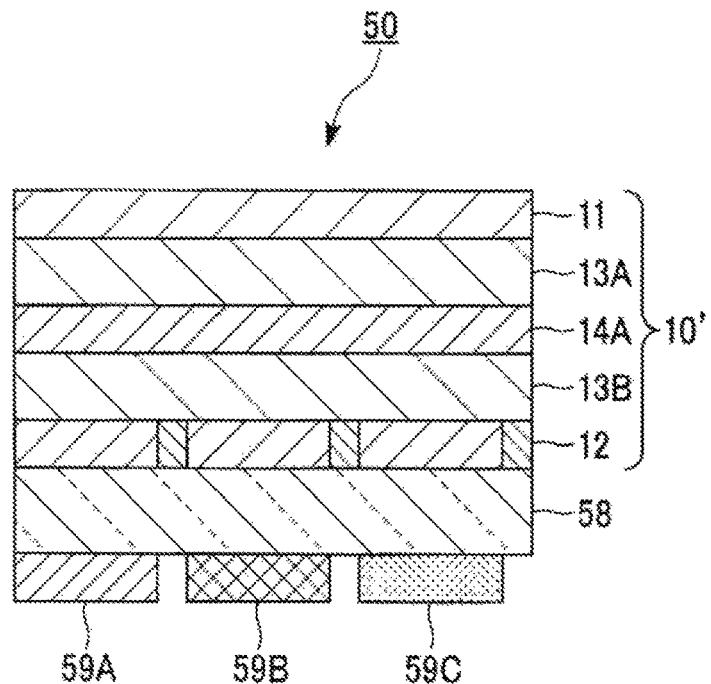
FIG. 5 is a cross-sectional view illustrating a schematic configuration of an organic EL device according to a fifth embodiment of the present invention.

FIG. 5 is a cross-sectional view illustrating a schematic configuration of a fifth embodiment of the organic EL device in the present invention.

As illustrated in FIG. 5, the organic EL device 50 of the embodiment has a structure in which multiple organic EL elements 10' (elements each formed of the first electrode 11, a laminate of the first light emitting unit 13A to the second light emitting unit 13B, and the second electrode 12) included in the organic EL device 10 of the aforementioned first embodiment are provided side by side on a transparent substrate 58. In this configuration, the organic EL elements 10' are sectioned based on the respective second electrodes 12 provided on the transparent substrate 58 at certain intervals.

Each of the organic EL elements 10' forms a light emitting portion of the organic EL device 50 and three different color filters 59A, 59B, 59C of red, green, and blue are arranged in turn at positions corresponding to the respective light emitting portions with the transparent substrate 58 between the organic EL elements 10' and the color filters 59A, 59B, 59C.

White light provided by each organic EL element 10' is converted to red light, green light, or blue light by one of the three different color filters 59A, 59B, 59C of red, green, and blue (red color filter 59A, green color filter 59B, or blue color filter 59C) and is emitted to the outside.

In the organic EL device 50 of the embodiment, it is thus possible to extract red light, green light, and blue light with high color purity based on white light with high color temperature, high luminous efficiency, and an excellent color rendering property.

An arrangement in which the red color filter 59A, the green color filter 59B, and the blue color filter 59C are arranged in turn forms an RGB arrangement. The RGB arrangement may be any arrangement selected from the group consisting of a stripe arrangement in which R, G, and B are arranged linearly, a mosaic arrangement in which R, G, and B are arranged diagonally, a delta arrangement in which R, G, and B are arranged in a triangular shape, and a pentile arrangement in which RG and GB are arranged alternately.

Image display with high resolution and natural color can be thereby achieved in a display device.

The organic EL device 50 of the embodiment can be thus preferably used in a display device.

Note that the organic EL device 50 of the embodiment is not necessarily limited to the aforementioned configuration and can be changed as appropriate.

In the organic EL device 50 of the embodiment, organic EL elements 20' (elements each formed of the first electrode 21, a laminate of the first light emitting unit 23A to the second light emitting unit 23B, and the second electrode 22) included in the organic EL device 20 in the aforementioned second embodiment can be used instead of the organic EL elements 10'.

Moreover, in the organic EL device 50 of the embodiment, organic EL elements 30' (elements each formed of the first electrode 31, a laminate of the first light emitting unit 33A to the third light emitting unit 33C, and the second electrode 32) included in the organic EL device 30 in the aforementioned third embodiment can be used instead of the organic EL elements 10'.

Furthermore, in the organic EL device 50 of the embodiment, organic EL elements 40' (elements each formed of the first electrode 41, a laminate of the first light emitting unit 43A to the third light emitting unit 43C, and the second electrode 42) included in the organic EL device 40 in the aforementioned fourth embodiment can be used instead of the organic EL elements 10'.

Moreover, the organic EL device 50 of the embodiment may have such a structure that the three different color filters of red, green, and blue are provided between the transparent substrate 58 and the second electrodes 12.

Moreover, in the organic EL device 50 of the embodiment, organic EL elements 30' (elements each formed of the first electrode 31, a laminate of the first light emitting unit 33A to the third light emitting unit 33C, and the second electrode 32) included in the organic EL device 30 in the aforementioned third embodiment can be used instead of the organic EL elements 10'.

Furthermore, in the organic EL device 50 of the embodiment, organic EL elements 40' (elements each formed of the first electrode 41, a laminate of the first light emitting unit 43A to the third light emitting unit 43C, and the second electrode 42) included in the organic EL device 40 in the aforementioned fourth embodiment can be used instead of the organic EL elements 10'.

Moreover, the organic EL device 50 of the embodiment may have such a structure that the three different color filters of red, green, and blue are provided between the transparent substrate 58 and the second electrodes 52.

Sixth Embodiment

Figure 6:
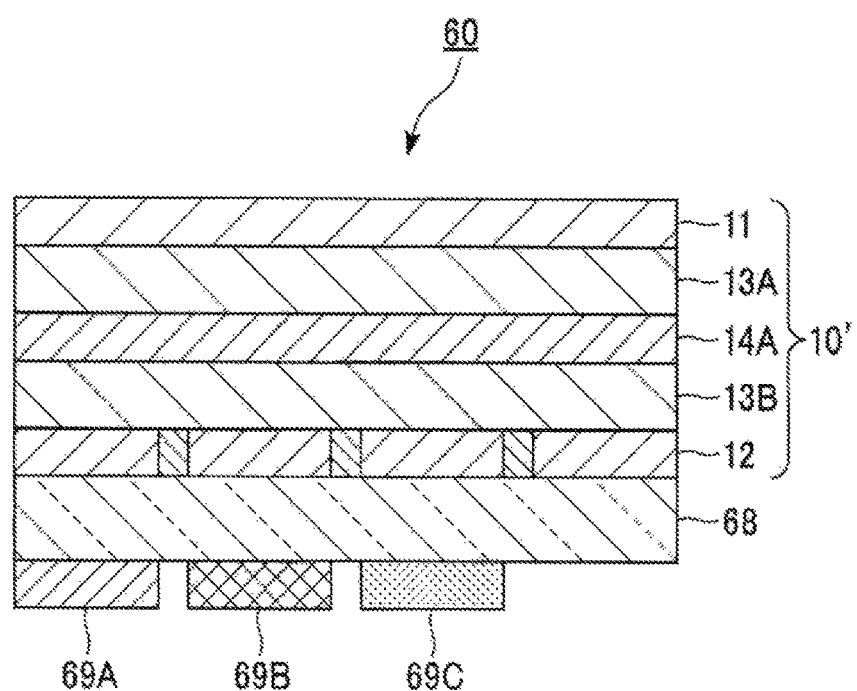
FIG. 6 is a cross-sectional view illustrating a schematic configuration of an organic EL device according to a sixth embodiment of the present invention.

FIG. 6 is a cross-sectional view illustrating a schematic configuration of a sixth embodiment of the organic EL device in the present invention.

As illustrated in FIG. 6, the organic EL device 60 of the embodiment has a structure in which the multiple organic EL elements 10' (elements each formed of the first electrode 11, the laminate of the first light emitting unit 13A to the second light emitting unit 13B, and the second electrode 12) included in the organic EL device 10 of the aforementioned first embodiment are provided side by side on a transparent substrate 68. In this configuration, the organic EL elements 10' are sectioned based on the respective second electrodes 12 provided on the transparent substrate 68 at certain intervals.

Each of the organic EL elements 10' forms a light emitting portion of the organic EL device 60 and three different color filters 69A, 69B, 69C of red, green, and blue and a no-color-filter portion are arranged in turn at positions corresponding to the respective light emitting portions with the transparent substrate 68 therebetween.

White light provided by each organic EL element 10' is converted to red light, green light, or blue light by one of the three different color filters 69A, 69B, 69C of red, green, and blue (red color filter 69A, green color filter 69B, or blue color filter 69C) and is emitted to the outside.

In the organic EL device 60 of the embodiment, it is thus possible to extract red light, green light, blue light with high color purity based on original white light with high color temperature, high luminous efficiency, and an excellent color rendering property.

Moreover, in the no-color-filter portion (portion where none of the red color filter 69A, green color filter 69B, and blue color filter 69C is provided on the transparent substrate 68 illustrated in FIG. 6), the white light provided by the organic EL element 10' is emitted to the outside as it is.

An arrangement in which the red color filter 69A, the green color filter 69B, and the blue color filter 69C are arranged in turn and the no-color-filter portion form an RGBW arrangement. The RGBW arrangement may be any arrangement selected from the group consisting of a stripe arrangement in which R, G, B, and W are arranged linearly, a mosaic arrangement in which R, G, B, and W are arranged diagonally, a delta arrangement in which R, G, B, and W are arranged in a triangular shape, and a pentile arrangement in which RG and BW are alternately arranged.

When white is displayed on a display, in the RGB method described above, light of a white backlight is absorbed by the color filters of the respective colors upon passing the color filters and the luminance of the light is thereby reduced. Accordingly, the light amount of the backlight needs to be increased and this leads to an increase in the power consumption of the display.

Meanwhile, in the RGBW method, there is no color filter in the light emitting portion of W. Accordingly, when white is displayed, the light emission from the white backlight can be effectively used as it is. Hence, there is no decrease in luminance and an operation can be achieved with low power consumption.

Thus, low power consumption and image display with high resolution and natural color can be both achieved in a display device.

The organic EL device 60 of the embodiment can be thus preferably used in a display device.

Note that the organic EL device 60 of the embodiment is not necessarily limited to the aforementioned configuration and can be changed as appropriate.

In the organic EL device 60 of the embodiment, the organic EL elements 20' (elements each formed of the first electrode 21, the laminate of the first light emitting unit 23A to the second light emitting unit 23B, and the second electrode 22) included in the organic EL device 20 in the aforementioned second embodiment can be used instead of the organic EL elements 10'.

Moreover, in the organic EL device 60 of the embodiment, the organic EL elements 30' (elements each formed of the first electrode 31, the laminate of the first light emitting unit 33A to the third light emitting unit 33C, and the second electrode 32) in the aforementioned third embodiment can be used instead of the organic EL elements 10'.

Furthermore, in the organic EL device 60 of the embodiment, the organic EL elements 40' (elements each formed of the first electrode 41, the laminate of the first light emitting unit 43A to the third light emitting unit 43C, and the second electrode 42) in the aforementioned fourth embodiment can be used instead of the organic EL elements 10'.

Moreover, the organic EL device 60 of the embodiment may have such a structure that the three different color filters of red, green, and blue are provided between the transparent substrate 68 and the second electrodes 12.

[Display Device]

An embodiment of the display device in the present invention is described.

Figure 7:
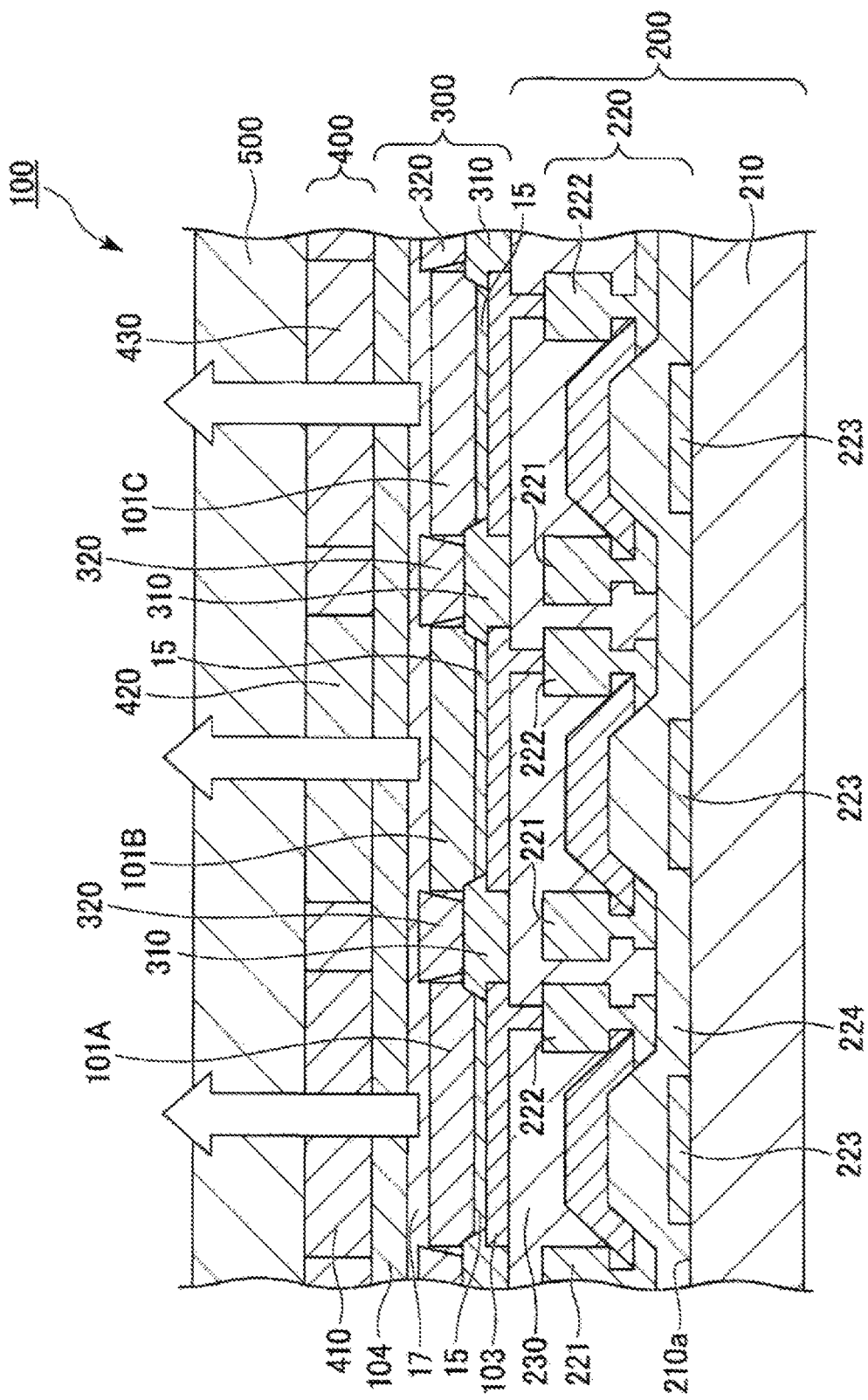
FIG. 7 is a cross-sectional view illustrating a schematic configuration of one embodiment of a display device in the present invention.

FIG. 7 is a cross-sectional view illustrating a schematic configuration of the embodiment of the display device in the present invention. In FIG. 7, the same constitutional elements as those in the first embodiment of the organic EL device in the present invention illustrated in FIG. 1 are denoted by the same reference numerals and description thereof is omitted. Moreover, although an example of the display device to which the present invention is applied is described herein, the display device of the present invention is not necessarily limited to such a configuration and changes can be made as appropriate.

The display device 100 of the embodiment includes, for example, the organic EL elements 10' (elements each formed of the first electrode 11, the laminate of the first light emitting unit 13A to the second light emitting unit 13B, and the second electrode 12) included in the organic EL device 10 in the first embodiment as light sources as described above. The organic EL elements 10' include a first light emitting layer 101A, a second light emitting layer 101B, and a third light emitting layer 101C.

In FIG. 7, a hole transport layer 17 is provided on the first light emitting layer 101A, the second light emitting layer 101B, and the third light emitting layer 101C and an electron transport layer 15 is provided below the first light emitting layer 101A, the second light emitting layer 101B, and the third light emitting layer 101C. However, the hole transport layer 17 and the electron transport layer 15 may be included in the first light emitting layer 101A, the second light emitting layer 101B, and the third light emitting layer 101C.

The display device 100 of the embodiment is a top emission, active matrix display device.

As illustrated in FIG. 7, the display device 100 of the embodiment includes a TFT substrate 200, an organic EL element 300, a color filter 400, and a sealing substrate 500. In the display device 100 of the embodiment, the TFT substrate 200, the organic EL element 300, the color filter 400, and the sealing substrate 500 are stacked one on top of another in this order to form a laminated structure.

The TFT substrate 200 includes a base substrate 210, a TFT element 220 which is provided on one surface 210 a of the base substrate 210, and an insulating layer 230 which is a planarization film layer (protection layer) provided on the one surface 210 a of the base substrate 210 to cover the TFT element 220.

A glass substrate, a flexible substrate made of plastic, and the like can be given as examples of the base substrate 210.

The TFT element 220 includes source electrodes 221, drain electrodes 222, gate electrodes 223, a gate insulating layer 224 formed on the gate electrodes 223, and channel regions provided on the gate insulating layer 224 and being in contact with the source electrodes 221 and the drain electrodes 222.

The organic EL element 300 has the same configuration as the organic EL elements 10'.

First partition walls (banks) 310 and second partition walls (ribs) 320 stacked thereon are provided between the first light emitting layer 101A and the second light emitting layer 101B, between the second light emitting layer 101B and the third light emitting layer 101C, and between the third light emitting layer 101C and the first light emitting layer 101A.

The first partition walls 310 are provided on the insulating layer 230 of the TFT element 220 and have such a tapered shape that, above the second electrodes 103, the width of the first partition walls 310 gradually decreases as the distance from the insulating layer 230 increases.

The second partition walls 320 are provided on the first partition walls 310 and have such a reverse-tapered shape that the width of the second partition walls 320 gradually increases as the distance from the first partition walls 310 increases.

The first partition walls 310 and the second partition walls 320 are made of an insulating material. A fluorine-containing resin can be given as an example of the material forming the first partition walls 310 and the second partition walls 320. Vinylidene fluoride, vinyl fluoride, trifluoroethylene, copolymers of these, and the like can be given as examples of a fluorine compound contained in the fluorine-containing resin. A phenol novolac resin, a polyvinyl phenol resin, an acrylic resin, a methacrylic resin, and combination of these can be given as examples of a resin contained in the fluorine-containing resin.

The first light emitting layer 101A, the second light emitting layer 101B, and the third light emitting layer 101C are provided on a second electrode 103 formed on the insulating layer 230 of the TFT elements 220, with a hole transport layer 15 provided between the insulating layer 230 and the light emitting portions 101A, 101B, 101C.

The second electrode 103 is connected to the drain electrodes 222 of the TFT elements 220.

The color filter 400 is provided on a first electrode 104 of the organic EL element 300. The color filter 400 includes a first color filter 410 corresponding to the first light emitting layer 101A, a second color filter 420 corresponding to the second light emitting layer 101B, and a third color filter 430 corresponding to the third light emitting layer 101C.

The first color filter 410 is a red color filter and is arranged to face the first light emitting layer 101A.

The second color filter 420 is a green color filter and is arranged to face the second light emitting layer 101B.

The third color filter 430 is a blue color filter and is arranged to face the third light emitting layer 101C.

A glass substrate, a flexible substrate made of plastic, and the like can be given as examples of the sealing substrate 500. When plastic is used for the base substrate 210 and the sealing substrate 500, the display device 100 of the embodiment is flexible.

Note that, as illustrated in FIG. 7, although the example in which the organic EL element 300 includes the first light emitting layer 101A, the second light emitting layer 101B, and the third light emitting layer 101C are described in the embodiment, the embodiment is not limited to this.

The display device 100 of the embodiment can provide white light with high color temperature and an excellent color rendering property. Since the display device 100 of the embodiment includes the organic EL elements 10' in the first embodiment, the display device 100 can provide white light with correlated color temperature of 3500 or more and an average color rendering index (Ra) of 70 or more.

Note that the present invention is not necessarily limited to the aforementioned embodiment and various changes can be made within a scope not departing from the spirit of the present invention.

In the display device 100 of the embodiment, the organic EL elements 20' (elements each formed of the first electrode 21, the laminate of the first light emitting unit 23A to the second light emitting unit 23B, and the second electrode 22) included in the organic EL device 20 in the aforementioned second embodiment can be used instead of the organic EL elements 10'.

Moreover, in the display device 100 of the embodiment, the organic EL elements 30' (elements each formed of the first electrode 31, the laminate of the first light emitting unit 33A to the third light emitting unit 33C, and the second electrode 32) included in the organic EL device 30 in the aforementioned third embodiment can be used instead of the organic EL elements 10'.

Furthermore, in the display device 100 of the embodiment, the organic EL elements 40' (elements each formed of the first electrode 41, the laminate of the first light emitting unit 43A to the third light emitting unit 43C, and the second electrode 42) included in the organic EL device 40 in the aforementioned fourth embodiment can be used instead of the organic EL elements 10'.

"Lighting Device"

An embodiment of the lighting device in the present invention is described.

Figure 8:
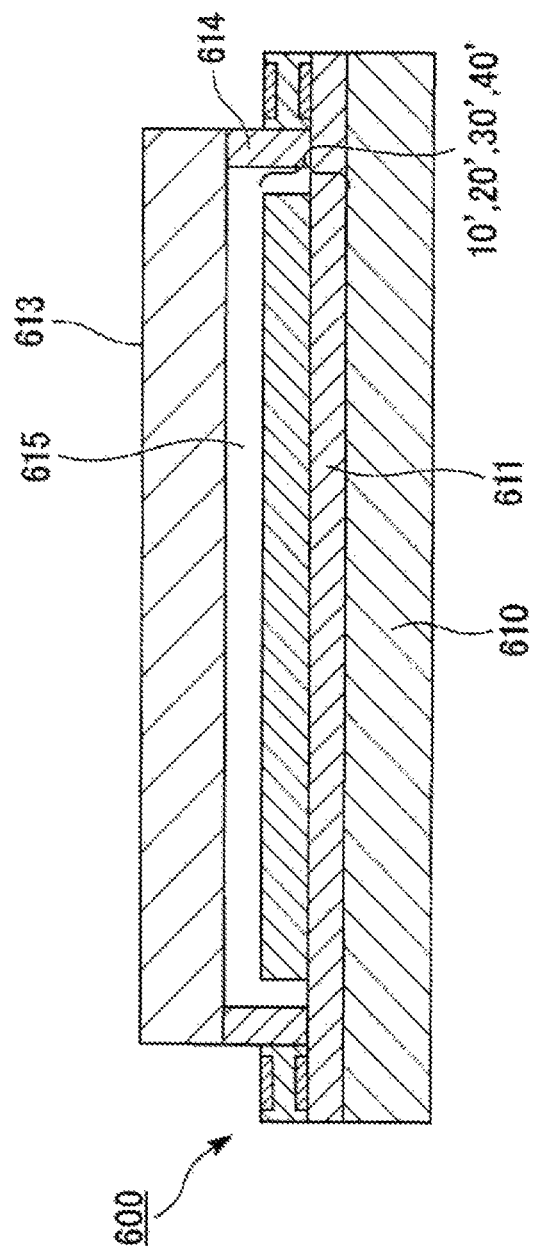
FIG. 8 is a cross-sectional view illustrating a schematic configuration of one embodiment of a lighting device in the present invention.

FIG. 8 is a cross-sectional view illustrating a configuration of one embodiment of the lighting device in the present invention. Although an example of the lighting device to which the present invention is applied is described herein, the lighting device of the present invention is not necessarily limited to such a configuration and various changes can be made as appropriate.

The lighting device 600 of the embodiment includes, for example, the organic EL device 10 in the aforementioned first embodiment as a light source. A base substrate 610 in the lighting device 600 of the embodiment corresponds to the substrate 18 in the organic EL element 10' and anode terminal electrodes 611 in the lighting device 600 corresponds to the second electrode 12 in the organic EL device 10. The organic EL device 10 includes the organic EL element 10' and the organic EL element 10' is formed of the first electrode 11, the laminate of the first light emitting unit 13A to the second light emitting unit 13B, and the second electrode 12.

As illustrated in FIG. 8, in the lighting device 600 of the embodiment, the multiple anode terminal electrodes 611 and cathode terminal electrodes (illustration omitted) are formed at sides or vertices of a periphery of the base substrate 610 so that the organic EL element 10' can uniformly emit light. The anode terminal electrodes 611 corresponds to the first electrode 11 or the second electrode 12 in the organic EL element 10'. The entire surfaces of the anode terminal electrodes 611 and the entire surfaces of the cathode terminal electrodes are covered with solder (underlying solder) to reduce wiring resistance. Moreover, the anode terminal electrodes 611 and the cathode terminal electrodes uniformly supply an electric current to the organic EL element 10' from the sides or vertices of the periphery of the substrate. For example, in order to uniformly supply an electric current to the organic EL element 10' formed in a quadrilateral shape, the lighting device 600 includes the anode terminal electrodes 611 on the sides and the cathode terminal electrodes at the vertices. Alternatively, for example, the lighting device 600 includes the anode terminal electrodes 611 on peripheries of L-shaped portions each including a vertex and extending over two sides and the cathode terminal electrodes in center portions of the respective sides.

Moreover, a sealing substrate 613 is arranged on the substrate to cover the organic EL element 10' to prevent degrading of the performance of the organic EL element 10' due to oxygen, water, and the like. The sealing substrate 613 is provided on the base substrate 610 with a peripheral sealing member 614 therebetween. A small gap 615 is provided between the sealing substrate 613 and the organic EL element 10'. This gap 615 is filled with a hygroscopic agent. The gap 615 may be filled with, for example, an inert gas such as nitrogen, silicone oil, or the like instead of the hygroscopic agent. Moreover, the gap 615 may be filled with a gel resin in which the hygroscopic agent is dispersed.

Note that, although the glass substrate is used as the base substrate 610 in the embodiment, a substrate made of a material such as plastic, metal, or ceramic may also be used. Moreover, in the embodiment, a glass substrate, a plastic substrate, or the like can be used as the sealing substrate 613. When plastic substrates are used as the base substrate and the sealing substrate, the lighting device 600 of the embodiment is flexible.

Moreover, a UV curable resin or a thermal setting resin with low oxygen permeability and low water permeability, a laser glass frit, or the like can be used for the sealing member 614.

The lighting device 600 of the embodiment may have a configuration including an optical film for improving the luminous efficiency, on the light extraction surface side.

The optical film used in the lighting device 600 of the embodiment is provided to improve the luminous efficiency and optimize the total luminous flux while maintaining the color rendering property.

An organic EL device emits light in a light emitting layer with a higher refractive index (refractive index of about 1.6 to 2.1) than air and it is generally said that only about 15% to 20% of light emitted from the light emitting layer can be extracted. This is because light incident on an interface at an angle equal to or above a critical angle is totally reflected and cannot be extracted to the outside of the element. Specifically, light is totally reflected between a transparent substrate and a transparent electrode or the light emitting layer to be guided through the transparent electrode or the light emitting layer and resultantly escapes in directions toward side surfaces of the element.

As a method for improving the extraction efficiency of the light, there are, for example, the following methods: a method of making a surface of the transparent substrate rough to prevent total reflection on an interface between the transparent substrate and air (see, for example, "U.S. Pat. No. 4,774,435"); a method of providing the substrate with a light condensing property to improve the efficiency (see, for example, "Japanese Patent Application Publication No. Sho 63-314795"); a method of forming reflection surfaces on the side surfaces of the organic EL device and the like (see, for example, "Japanese Patent Application Publication No. Hei 1-220394"); a method of introducing a flat layer with an intermediate refractive index, between the substrate and the light emitting body to form a reflection prevention film (see, for example, "Japanese Patent Application Publication No. Sho 62-172691"); a method of introducing a flat layer with a lower refractive index than the substrate, between the substrate and the light emitting body (see, for example, "Japanese Patent Application Publication No. 2001-202827"); a method of forming a diffraction grading between any two of the substrate, the transparent electrode layer, and the light emitting layer (including between the substrate and the outside) (see, for example, "Japanese Patent Application Publication No. Hei 11-283751"); and the like.

Note that, in order to improve the color rendering property as described above, the lighting device 600 may have a structure in which a microlens array or the like is further provided on a surface of the aforementioned optical film or may be combined with a light condensing sheet. This allows the light to be condensed in a specific direction, for example, a forward direction relative to the light emitting surface, thereby improving the luminance in the specific direction. Furthermore, a light diffusion film may be used together with the light condensing sheet to control a light emission angle from the organic EL device 10. For example, a light diffusion film (LIGHT-UP) manufactured by Kimoto Co., Ltd. or the like can be used as the light diffusion film.

Note that the present invention is not necessarily limited to the aforementioned embodiment and various changes can be made within a scope not departing from the spirit of the present invention.

In the lighting device 600 of the embodiment, the organic EL element 20' (element formed of the first electrode 21, the laminate of the first light emitting unit 23A to the second light emitting unit 23B, and the second electrode 22) included in the organic EL device 20 in the aforementioned second embodiment can be used instead of the organic EL element 10'.

Moreover, in the lighting device 600 of the embodiment, the organic EL element 30' (element formed of the first electrode 31, the laminate of the first light emitting unit 33A to the third light emitting unit 33C, and the second electrode 32) included in the organic EL device 30 in the aforementioned third embodiment can be used instead of the organic EL element 10'.

Furthermore, in the lighting device 600 of the embodiment, the organic EL element 40' (element formed of the first electrode 41, the laminate of the first light emitting unit 43A to the third light emitting unit 43C, and the second electrode 42) included in the organic EL device 40 in the aforementioned fourth embodiment can be used instead of the organic EL elements 10'.

EXAMPLES

Effects of the present invention are made clearer below by using Examples.

Note that the present invention is not limited to following Examples and changes can be made as appropriate within a scope not departing from the spirit of the invention.

Example 1

"Manufacturing of Organic EL Device"

In Example 1, an organic EL device having a schematic structure illustrated in FIG. 9 was manufactured.

Specifically, first, there was prepared a soda-lime glass substrate with a thickness of 0.7 mm on which an ITO film with a thickness of 100 nm, a width of 2 mm, and a sheet resistance of about 20 $\Psi/\square$ was formed.

Then, the substrate was subjected to ultrasonic cleaning by using neutral detergent, ion-exchanged water, acetone, and isopropyl alcohol for 5 minutes for each cleaner and then subjected to spin drying and $UV/O_3$ treatment.

Next, vapor deposition crucibles (made of tantalum or alumina) in a vacuum deposition apparatus were filled respectively with materials used to form layers illustrated in FIG. 1. Then, the substrate was set in the vacuum deposition apparatus, electric power was supplied to the vapor deposition crucibles to heat them in a reduced pressure atmosphere with a degree of vacuum of $1\times10^{-4}$ Pa or less, and each of the layers was vapor-deposited to a predetermined film thickness at a deposition rate of 0.1 nm per second.

Moreover, the cathode was vapor-deposited to a predetermined film thickness at a deposition rate of 1 nm per second.

"Evaluation of Organic EL Element"

The organic EL device of Example 1 manufactured as described above was connected to a measurement unit driver (trade name: KEITHLEY 2425, manufactured by Keithley Instruments, LLC) and power with a constant current of 3 mA/cm² was supplied to the organic EL device to cause it to emit light in an integrating sphere. Then, the emission spectrum and the luminous flux value of the organic EL device were measured by using a multichannel spectrometer (trade name: USB 2000, manufactured by Ocean Optics, Inc.). Moreover, the external quantum efficiency (EQE) (%) of the organic EL device of Example 1 was calculated based on the results of this measurement.

Then, the emitted light color was evaluated based on the measurement results by using chromaticity coordinates in the CIE color system. Moreover, the emitted light color was classified into one of light source colors specified in "JIS Z 9112" based on the chromaticity coordinates. Furthermore, the deviation duv from the black body locus was derived based on the specifications of "JIS Z 8725." Moreover, the average color rendering index (Ra) of the emitted light color was derived by using the method specified in "JIS Z 8726." The results of these evaluations are collectively illustrated in FIG. 10.

Moreover, the luminance and the spectral radiance of the white light emitted from the organic EL device of Example 1 were evaluated by the following method.

<Evaluation Method of Luminance and Spectral Radiance>

In order to measure the light distribution characteristics of the luminance of the white light entering the substrate and the spectral radiances of red light, green light, and blue light, a hemispherical lens was fixed to a surface of the substrate with matching liquid (refractive liquid) provided between the organic EL device and the hemispherical lens. Since the matching liquid and the hemispherical lens used herein have the same refractive index as the substrate, all light emission components entering the substrate can be extracted to the atmosphere.

The organic EL device was connected to the measurement unit driver (trade name: KEITHLEY 2425, manufactured by Keithley Instruments, LLC) and power with a constant current of 3 mA/cm² was supplied to the organic EL device to cause it to emit light. Then, a jig to which the organic EL device was fixed was rotated from 0 to 80 degrees in increments of five degrees with the organic EL device being turned on. The luminance of the organic EL device and the spectral radiance at each emission wavelength at each angle were measured by using a spectroradiometer (trade name: CS-2000, manufactured by Konica Minolta, Inc.).

Figure 11:
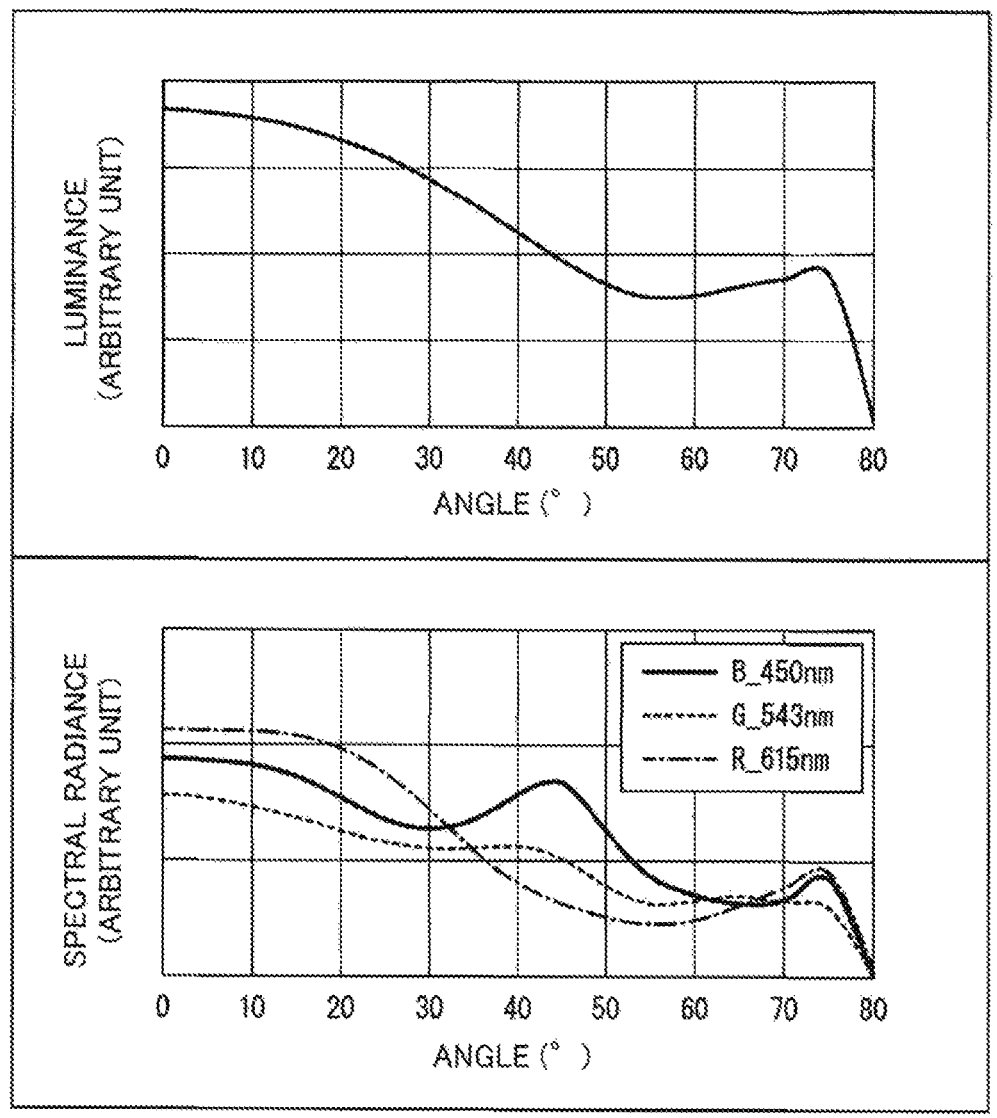
FIG. 11 is graphs illustrating distribution characteristics of light emitted into a substrate of the organic EL device of Example 1.

The results are illustrated in FIG. 11.

As illustrated in FIG. 11, it was found that, in the organic EL device 10 of Example 1, the distribution characteristics of light emitted into the substrate were such that the luminance of the white light took the maximum in an angle range of 0 to 15 degrees as viewed in the direction of an axis perpendicular to a plane direction of the substrate. Moreover, it was found that the spectral radiance at the maximum emission wavelength (450 nm) of the blue light took the maximum in an angle range of 0 to 20 degrees with respect to the axis perpendicular to the plane direction of the substrate. Furthermore, it was found that the spectral radiance at the maximum emission wavelength (450 nm) of the blue light took the local maximum in an angle range of 40 to 60 degrees with respect to the axis perpendicular to the plane direction of the substrate.

Figure 10:
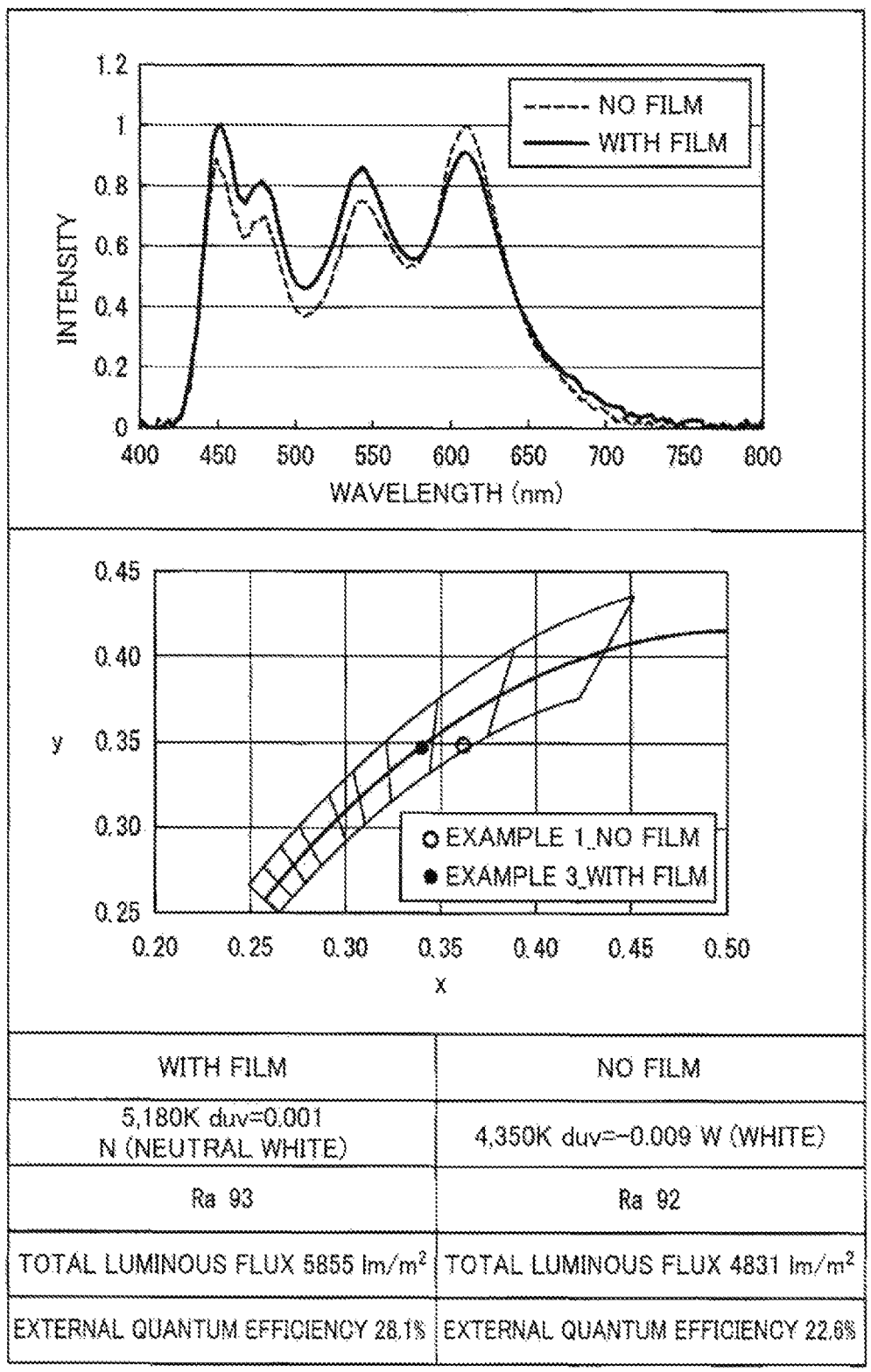
FIG. 10 is a view illustrating evaluation results of the organic EL device of Example 1 and a lighting device of Example 3.

In the organic EL device of Example 1, the total luminous flux can be thereby preferably optimized. As illustrated in FIG. 10, the organic EL device of Example 1 was able to provide white light with a total luminous flux of 4000 lm/m² or more. Moreover, the organic EL device of Example 1 was able to provide white light with color temperature of 4000 K or more and Ra of 90 or more by being optimized in the total luminous flux.

Example 2

An organic EL device of Example 2 having a schematic structure illustrated in FIG. 12 was manufactured by using a manufacturing method similar to that of Example 1.

Note that the ITO film formed on the soda-lime glass substrate had a thickness of 300 nm and a sheet resistance of 10 Ω/□.

Figure 13:
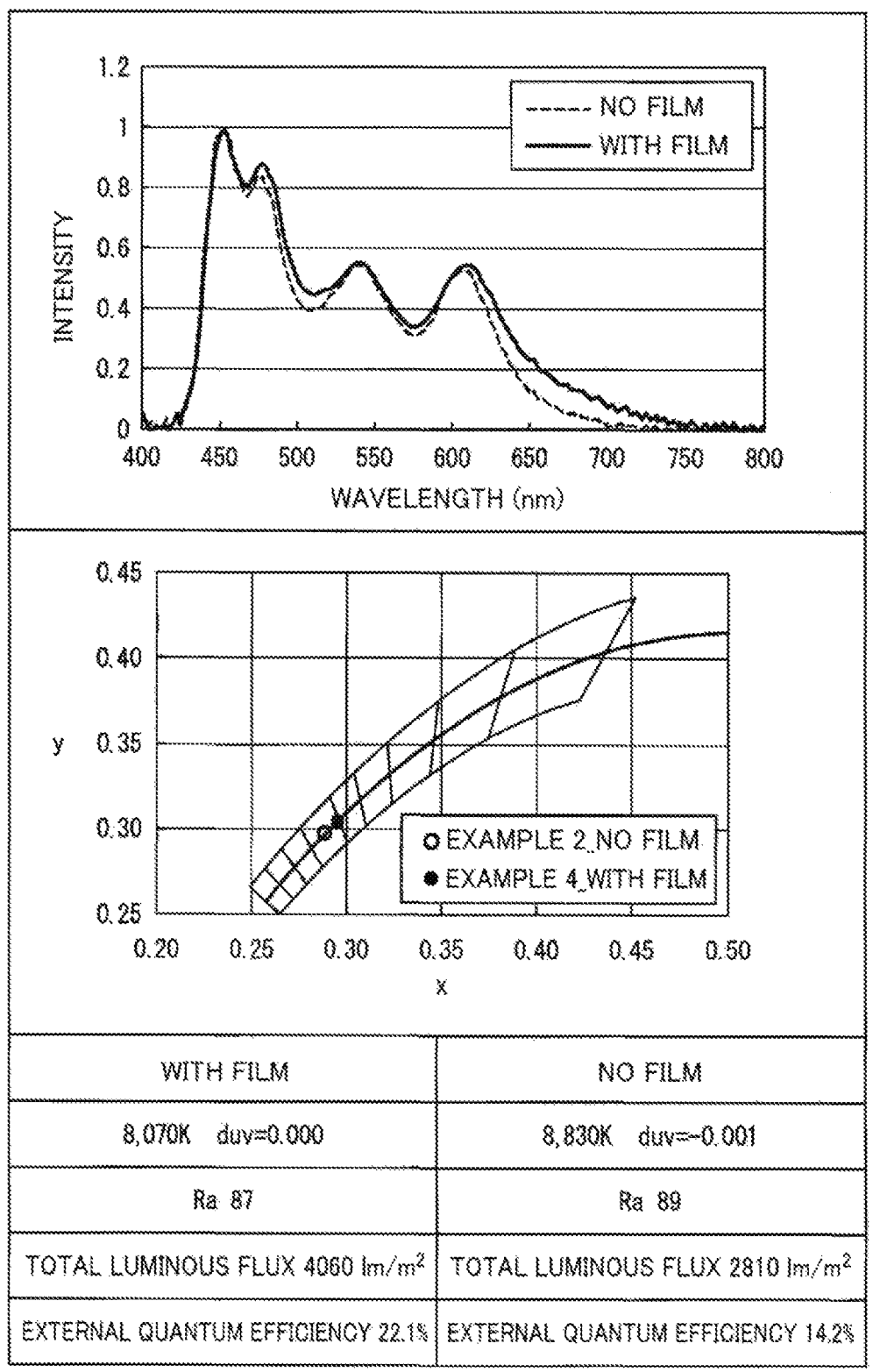
FIG. 13 is a view illustrating evaluation results of the organic EL device of Example 2 and a lighting device of Example 4.

Then, the organic EL device of Example 2 was evaluated in the same methods as those in Example 1. The results of the evaluations are illustrated in FIGS. 13 and 14.

Figure 14:
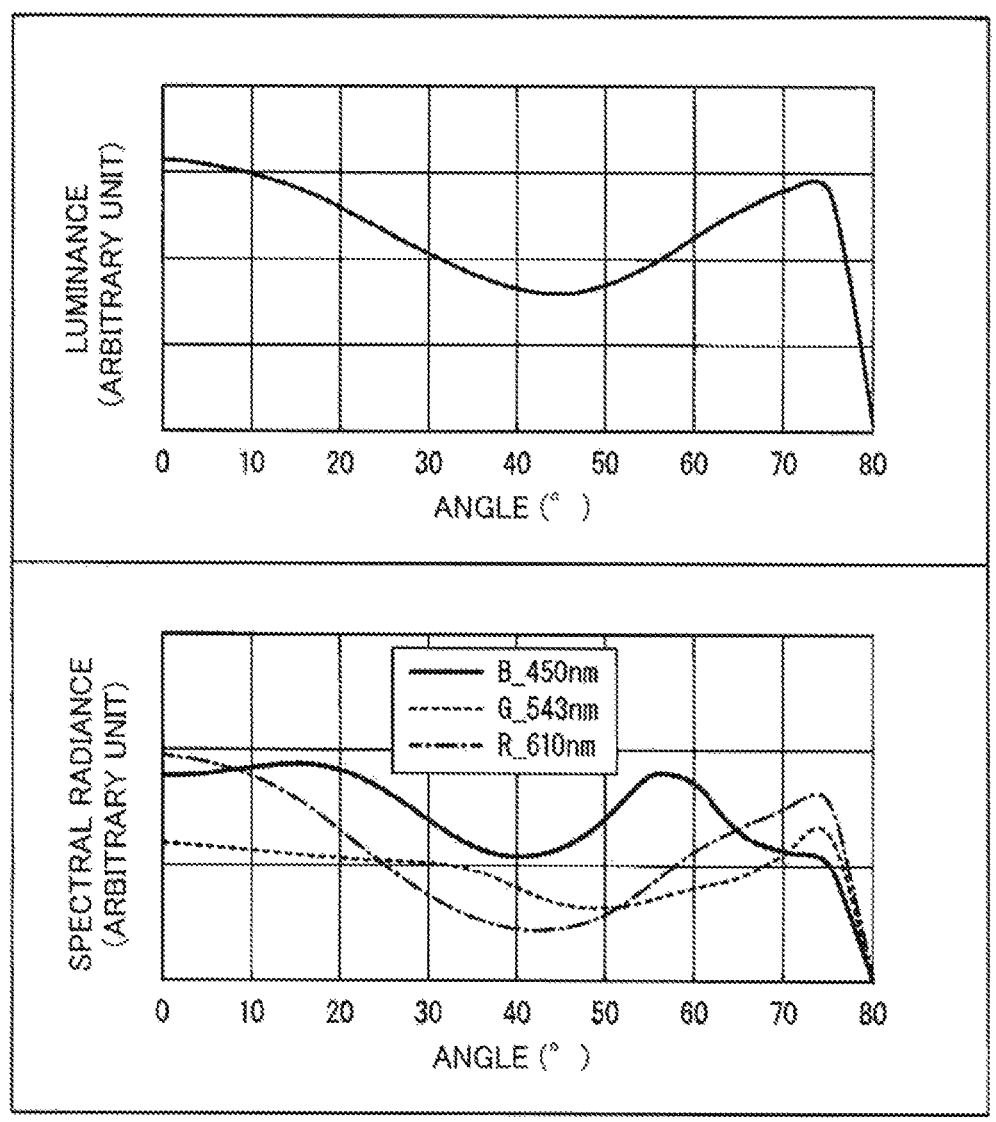
FIG. 14 is graphs illustrating distribution characteristics of light emitted into a substrate of the organic EL device of Example 2.

As illustrated in FIG. 14, it was found that, in the organic EL device 10 of Example 2, the distribution characteristics of light emitted into the substrate were such that the luminance of the white light took the maximum in an angle range of 0 to 15 degrees as viewed in the direction of an axis perpendicular to a plane direction of the substrate. Moreover, it was found that the spectral radiance at the maximum emission wavelength (450 nm) of the blue light took the maximum in an angle range of 0 to 20 degrees with respect to the axis perpendicular to the plane direction of the substrate. Furthermore, it was found that the spectral radiance at the maximum emission wavelength (450 nm) of the blue light took the local maximum in an angle range of 40 to 60 degrees with respect to the axis perpendicular to the plane direction of the substrate.

In the organic EL device of Example 2, the total luminous flux can be thereby preferably optimized. As illustrated in FIG. 13, the organic EL device of Example 2 was able to provide white light with a total luminous flux of 2000 lm/m² or more. Moreover, the organic EL device of Example 2 was able to provide white light with color temperature of 8000 K or more and Ra of 85 or more by being optimized in the total luminous flux.

Example 3

A lighting device in which an optical film was attached to the light extraction surface (anode) side of the aforementioned organic EL device of Example 1 was manufactured.

Then, the lighting device of Example 3 was evaluated in the same methods as those in Example 1. The results of the evaluations are illustrated in FIGS. 10 and 11.

As illustrated in FIG. 10, it was found that, in the lighting device of Example 3, attaching the optical film onto the light extraction surface (anode) side of the organic EL device changed the shape of the emission spectrum from that in the case where no optical film was attached (illustrated by a broken line in the graph). Particularly, it was found that the light emission intensity at the maximum emission wavelength of the blue light was relatively higher.

In the lighting device of Example 3, the total luminous flux can be thereby preferably optimized. As illustrated in FIG. 10, the lighting device of Example 3 was able to provide white light with a total luminous flux of 5000 lm/m² or more. Moreover, the lighting device of Example 3 was able to provide white light with color temperature of 5000 K or more and Ra of 90 or more by being optimized in the total luminous flux.

Example 4

A lighting device in which an optical film was attached to the light extraction surface (anode) side of the aforementioned organic EL device of Example 2 was manufactured.

Then, the lighting device of Example 4 was evaluated in the same methods as those in Example 1. The results of the evaluations are illustrated in FIGS. 13 and 14.

As illustrated in FIG. 13, it was found that, in the lighting device of Example 4, attaching the optical film onto the light extraction surface (anode) side of the organic EL device changed the shape of the emission spectrum from that in the case where no optical film was attached (illustrated by a solid line in the graph).

In the lighting device of Example 4, the total luminous flux can be thereby preferably optimized. As illustrated in FIG. 13, the lighting device of Example 4 was able to provide white light with a total luminous flux of 4000 lm/m$^2$ or more. Moreover, the lighting device of Example 4 was able to provide white light with color temperature of 8000 K or more and Ra of 85 or more by being optimized in the total luminous flux.

INDUSTRIAL APPLICABILITY

According to one aspect described above, it is possible to provide an organic electroluminescent device which can provide white light with high color temperature and an excellent color rendering property by being optimized in total luminous flux and is thus suitable for a display device and a lighting device and also provide a display device and a lighting device including this organic electroluminescent device.

DESCRIPTION OF REFERENCE NUMERALS 10 organic electroluminescent device (organic EL device)
10' organic EL element
11 first electrode
12 second electrode
13A first light emitting unit (light emitting unit)
13B second light emitting unit (light emitting unit)
14A charge generating layer
15 electron transport layer
15A first electron transport layer
15B second electron transport layer
16A first light emitting layer
16B second light emitting layer
17A first hole transport layer
17B second hole transport layer
18 substrate
20 organic EL device
20' organic EL element
21 first electrode
22 second electrode
23A first light emitting unit (light emitting unit)
23B second light emitting unit (light emitting unit)
24A charge generating layer
25A first electron transport layer
25B second electron transport layer
26A first light emitting layer
26B second light emitting layer
27A first hole transport layer
27B second hole transport layer
28 substrate
30 organic EL device
30' organic EL element
31 first electrode
32 second electrode
33A first light emitting unit (light emitting unit)
33B second light emitting unit (light emitting unit)
33C third light emitting unit (light emitting unit)
34A first charge generating layer
34B second charge generating layer
35A first electron transport layer
35B second electron transport layer
35C third electron transport layer
36A first light emitting layer
36B second light emitting layer
36C third light emitting layer
37A first hole transport layer
37B second hole transport layer
37C third hole transport layer
38 substrate
40 organic EL device
40' organic EL element
41 first electrode
42 second electrode
43A first light emitting unit (light emitting unit)
43B second light emitting unit (light emitting unit)
43C third light emitting unit (light emitting unit)
44A first charge generating layer
44B second charge generating layer
45A first electron transport layer
45B second electron transport layer
45C third electron transport layer
46A first light emitting layer
46B second light emitting layer
46C third light emitting layer
47A first hole transport layer
47B second hole transport layer
47C third hole transport layer
48 substrate
50 organic EL device
58 transparent substrate
59A red color filter (color filter)
59B green color filter (color filter)
59C blue color filter (color filter)
60 organic EL device
68 transparent substrate
69A red color filter (color filter)
69B green color filter (color filter)
69C blue color filter (color filter)
100 display device
101A first light emitting layer
101B second light emitting layer
101C third light emitting layer
103 second electrode
104 first electrode
200 TFT substrate
210 base substrate
220 TFT element
221 source electrode
222 drain electrode
223 gate electrode
224 gate insulating layer
230 planarization film layer (protection layer)
300 organic EL element
310 first partition wall (bank)
320 second partition wall (rib)
400 color filter
410 first color filter
420 second color filter
430 third color filter
500 sealing substrate
600 lighting device
611 anode terminal electrode
613 sealing substrate
614 sealing member
615 gap

The invention claimed is:

1. An organic electroluminescent device having a structure in which a plurality of light emitting units each including a light emitting layer made of at least an organic compound are stacked one on top of another between a first electrode and a second electrode with a charge generating layer sandwiched between each pair of the adjacent light emitting units, the organic electroluminescent device capable of providing white light through a substrate adjacent to the first electrode or the second electrode by causing the plurality of light emitting units to emit light, wherein
the white light produced by light emission of the plurality of light emitting units is formed of red light, green light, and blue light,
distribution characteristics of light emitted into the substrate are such that a luminance of the white light takes a maximum in an angle range of 0 to 15 degrees with respect to an axis perpendicular to a plane direction of the substrate, and
a spectral radiance at a maximum emission wavelength of the blue light takes a maximum in an angle range of 0 to 20 degrees with respect to the axis perpendicular to the plane direction of the substrate.

2. The organic electroluminescent device according to claim 1, wherein the distribution characteristics of the light emitted into the substrate are such that the spectral radiance at the maximum emission wavelength of the blue light takes a local maximum in an angle range of 40 to 60 degrees with respect to the axis perpendicular to the plane direction of the substrate.

3. The organic electroluminescent device according to claim 1, wherein correlated color temperature of the white light is 3500 K or more.

4. The organic electroluminescent device according to claim 1, wherein
one of the plurality of light emitting units includes a blue light emitting layer which emits the blue light, and
the blue light emitting layer is formed of a blue fluorescent light emitting layer containing a blue fluorescent material.

5. The organic electroluminescent device according to claim 4, wherein the blue light includes a delayed fluorescence component.

6. The organic electroluminescent device according to claim 1, wherein
one of the plurality of light emitting units includes a blue light emitting layer which emits the blue light, and
the blue light emitting layer is formed of a blue phosphorescent light emitting layer containing a blue phosphorescent material.

7. The organic electroluminescent device according to claim 1, wherein an average color rendering index (Ra) of the white light is 70 or more.

8. The organic electroluminescent device according to claim 1, the organic electroluminescent device capable of providing the white light through the substrate adjacent to the first electrode or the second electrode by causing the plurality of light emitting units to emit light, comprising:
a first light emitting unit formed of a blue light emitting unit including a blue light emitting layer which emits the blue light; and
a second light emitting unit formed of a red/green light emitting unit including a red light emitting layer which emits the red light and a green light emitting layer which emits the green light or of a red-green light emitting unit which emits the red light and the green light, wherein
the first light emitting unit and the second light emitting unit are stacked one on top of the other with a first charge generating layer sandwiched therebetween, and
the organic electroluminescent device has a structure in which the second electrode, the second light emitting unit, the first charge generating layer, the first light emitting unit, and the first electrode are stacked one on top of another in this order.

9. The organic electroluminescent device according to claim 1, the organic electroluminescent device having the structure in which the plurality of light emitting units each including the light emitting layer made of at least the organic compound are stacked one on top of another between the first electrode and the second electrode with the charge generating layer sandwiched between each pair of the adjacent light emitting units, the organic electroluminescent device capable of providing the white light through the substrate adjacent to the first electrode or the second electrode by causing the plurality of light emitting units to emit light, comprising:
a first light emitting unit formed of a red/green light emitting unit including a red light emitting layer which emits the red light and a green light emitting layer which emits the green light or of a red-green light emitting unit which emits the red light and the green light; and
a second light emitting unit formed of a blue light emitting unit including a blue light emitting layer which emits the blue light, wherein
the first light emitting unit and the second light emitting unit are stacked one on top of the other with a first charge generating layer sandwiched therebetween, and
the organic electroluminescent device has a structure in which the second electrode, the second light emitting unit, the first charge generating layer, the first light emitting unit, and the first electrode are stacked one on top of another in this order.

10. The organic electroluminescent device according to claim 1, the organic electroluminescent device capable of providing the white light through the substrate adjacent to the first electrode or the second electrode by causing the plurality of light emitting units to emit light, comprising:
a first light emitting unit formed of a red/green light emitting unit including a red light emitting layer which emits the red light and a green light emitting layer which emits the green light or of a red-green light emitting unit which emits the red light and the green light;
a second light emitting unit formed of a blue light emitting unit including a blue light emitting layer which emits the blue light; and
a third light emitting unit formed of a blue light emitting unit including a blue light emitting layer which emits the blue light, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent device has a structure in which the second electrode, the third light emitting unit, the second charge generating layer, the second light emitting unit, the first charge generating layer, the first light emitting unit, and the first electrode are stacked one on top of another in this order.

11. The organic electroluminescent device according to claim 1, the organic electroluminescent device capable of providing the white light through the substrate adjacent to the first electrode or the second electrode by causing the plurality of light emitting units to emit light, comprising:
a first light emitting unit formed of a blue light emitting unit including a blue light emitting layer which emits the blue light;
a second light emitting unit formed of a red/green light emitting unit including a red light emitting layer which emits the red light and a green light emitting layer which emits the green light or of a red-green light emitting unit which emits the red light and the green light; and
a third light emitting unit formed of a blue light emitting unit including a blue light emitting layer which emits the blue light, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent device has a structure in which the second electrode, the third light emitting unit, the second charge generating layer, the second light emitting unit, the first charge generating layer, the first light emitting unit, and the first electrode are stacked one on top of another in this order.

12. The organic electroluminescent device according to claim 1, wherein
the charge generating layer is formed of an electrically insulating layer made of an electron accepting material and an electron donating material, and
a specific resistance of the electrically insulating layer is $1.0 \times 10^2$ Ω·cm or more.

13. The organic electroluminescent device according to claim 12, wherein the specific resistance of the electrically insulating layer is $1.0 \times 10^5$ Ω·cm or more.

14. The organic electroluminescent device according to claim 1, characterized in that
each of the charge generating layers is formed of a mixed layer of different materials and one component of the mixed layer forms a charge transfer complex by redox, and
when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

15. The organic electroluminescent device according to claim 1, characterized in that
each of the charge generating layers is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

16. The organic electroluminescent device according to claim 1, characterized in that the charge generating layers contain a compound having a structure expressed by formula (1):

[Chem. 1]

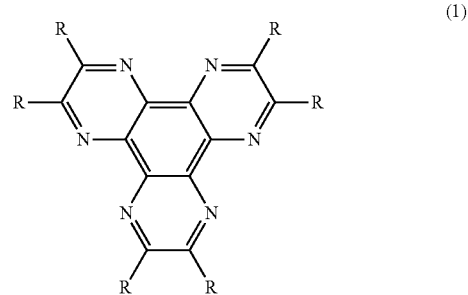

(1)

where R represents an electron withdrawing group of F, Cl, Br, I, CN, or $CF_3$.

17. The organic electroluminescent device according to claim 1, characterized in that
the organic electroluminescent element comprises at least three color filters different from one another, and
an arrangement of the at least three color filters different from one another changes the white light produced by the light emission of the plurality of light emitting units to light of a different color.

18. The organic electroluminescent device according to claim 17, wherein the arrangement of the at least three color filters different from one another is one selected from the group consisting of a stripe arrangement, a mosaic arrangement, a delta arrangement, and a pentile arrangement.

19. The organic electroluminescent device according to claim 17, wherein
the at least three color filters different from one another are a red color filter, a green color filter, and a blue color filter, and
the organic electroluminescent device has an RGB arrangement in which the three color filters different from one another are arranged in turn.

20. The organic electroluminescent device according to claim 19, wherein
the organic electroluminescent device has an RGBW arrangement including the RGB arrangement, and
the color filters are not arranged in an arrangement portion of W.

21. The organic electroluminescent device according to claim 20, wherein the RGBW arrangement is one selected from the group consisting of a stripe arrangement, a mosaic arrangement, a delta arrangement, and a pentile arrangement.

22. A display device comprising the organic electroluminescent device according to claim 17.

23. The display device according to claim 22, wherein
the substrate is a base substrate or a sealing substrate,
the base substrate or the sealing substrate is formed of a flexible substrate, and
the display device is flexible.

24. A lighting device comprising the organic electroluminescent device according to claim 1.

25. The lighting device according to claim 24, comprising an optical film on a light extraction surface side of the organic electroluminescent device.

26. The lighting device according to claim 25, wherein deviation duv of the white light is in a range of −0.01 to +0.01.

27. The lighting device according to claim 24, wherein
the substrate is a base substrate or a sealing substrate,
the base substrate or the sealing substrate is formed of a flexible substrate, and
the lighting device is flexible.

* * * * *